(12) United States Patent
Gupta et al.

(10) Patent No.: US 10,867,239 B2
(45) Date of Patent: Dec. 15, 2020

(54) DIGITAL ARCHITECTURE SUPPORTING ANALOG CO-PROCESSOR

(71) Applicant: Spero Devices, Inc., Acton, MA (US)

(72) Inventors: Jai Gupta, Acton, MA (US); Nihar Athreyas, Acton, MA (US); Abbie Mathew, Westford, MA (US)

(73) Assignee: SPERO DEVICES, INC., Acton, MA (US)

( * ) Notice: Subject to any disclaimer, the term of this patent is extended or adjusted under 35 U.S.C. 154(b) by 0 days.

(21) Appl. No.: 16/235,242

(22) Filed: Dec. 28, 2018

(65) Prior Publication Data

US 2019/0205741 A1   Jul. 4, 2019

Related U.S. Application Data

(60) Provisional application No. 62/611,870, filed on Dec. 29, 2017.

(51) Int. Cl.
*G06N 3/063* (2006.01)
*G06F 17/16* (2006.01)
*G06F 9/38* (2018.01)
*G06F 17/13* (2006.01)
*G06F 17/14* (2006.01)
(Continued)

(52) U.S. Cl.
CPC ......... *G06N 3/0635* (2013.01); *G06F 9/3853* (2013.01); *G06F 9/3877* (2013.01); *G06F 15/00* (2013.01); *G06F 17/13* (2013.01); *G06F 17/141* (2013.01); *G06F 17/16* (2013.01); *G06F 30/367* (2020.01)

(58) Field of Classification Search
CPC ..... G06N 3/0635; G06F 15/00; G06F 9/3853; G06F 9/3877; G06F 17/141; G06F 17/16; G06F 17/13; G06F 17/5036
See application file for complete search history.

(56) References Cited

U.S. PATENT DOCUMENTS 8,352,847 B2 *  1/2013  Gunnam ................. G06F 17/16
                                                        714/758
9,152,827 B2    10/2015 Linderman et al.
9,646,243 B1 *  5/2017  Gokmen ............. G06N 3/0635
(Continued)

OTHER PUBLICATIONS

Boxun Li, "Memristor-based Approximated Computation", 2013, IEEE (Year: 2013).*

(Continued)

*Primary Examiner* — Kamran Afshar
*Assistant Examiner* — Imad Kassim
(74) *Attorney, Agent, or Firm* — Hamilton, Brook, Smith & Reynolds, P.C.

(57) ABSTRACT

A co-processor is configured for performing vector matrix multiplication (VMM) to solve computational problems such as partial differential equations (PDEs). An analog Discrete Fourier Transform (DFT) can be implemented by invoking VMM of input signals with Fourier basis functions using analog crossbar arrays. Linear and non-linear PDEs can be solved by implementing spectral PDE solution methods as an alternative to massively discretized finite difference methods, while exploiting inherent parallelism realized through the crossbar arrays. A digital controller interfaces with the crossbar arrays to direct write and read operations to the crossbar arrays.

19 Claims, 15 Drawing Sheets

(51) Int. Cl.
G06F 15/00 (2006.01)
G06F 30/367 (2020.01)

(56) References Cited

U.S. PATENT DOCUMENTS

| | | | |
|---|---|---|---|
| 9,785,615 B1* | 10/2017 | Merced Grafals | G06F 17/16 |
| 9,824,753 B2 | 11/2017 | Hamdioui et al. | |
| 10,055,383 B1* | 8/2018 | Shafiee Ardestani | G06F 17/16 |
| 10,127,494 B1* | 11/2018 | Cantin | G06N 3/0445 |
| 10,210,138 B2* | 2/2019 | Bekas | G06F 17/16 |
| 10,242,737 B1* | 3/2019 | Lin | G11C 13/004 |
| 10,283,190 B1* | 5/2019 | Li | G11C 11/2259 |
| 2008/0291198 A1* | 11/2008 | Chun | G06T 15/005 |
| | | | 345/419 |
| 2014/0172937 A1 | 6/2014 | Linderman et al. | |
| 2014/0289179 A1 | 9/2014 | Di Castro et al. | |
| 2015/0170025 A1 | 6/2015 | Wu et al. | |
| 2016/0224465 A1 | 8/2016 | Morad et al. | |
| 2017/0052857 A1* | 2/2017 | Jennings | G06F 11/2028 |
| 2017/0124025 A1 | 5/2017 | Gokmen | |
| 2017/0168990 A1* | 6/2017 | Kernert | G06F 17/16 |
| 2017/0178725 A1* | 6/2017 | Yang | G11C 13/003 |
| 2017/0220526 A1* | 8/2017 | Buchanan | G06F 7/5443 |
| 2017/0228345 A1 | 8/2017 | Gupta et al. | |
| 2017/0316828 A1* | 11/2017 | Hu | G11C 13/0026 |
| 2018/0095930 A1* | 4/2018 | Lu | G11C 7/1006 |
| 2018/0173677 A1* | 6/2018 | Muralimanohar | G06F 7/523 |
| 2018/0247187 A1* | 8/2018 | Chung | G06N 3/04 |
| 2018/0309451 A1* | 10/2018 | Lu | H03K 19/17748 |
| 2018/0341642 A1* | 11/2018 | Akerib | G06F 17/2785 |
| 2018/0364785 A1* | 12/2018 | Hu | G06F 1/3206 |
| 2018/0373902 A1* | 12/2018 | Muralimanohar | G11C 11/15 |
| 2019/0004737 A1* | 1/2019 | Khan | G06F 3/0661 |
| 2019/0019538 A1* | 1/2019 | Li | G06N 3/08 |
| 2019/0019564 A1* | 1/2019 | Li | G11C 11/5628 |
| 2019/0114555 A1* | 4/2019 | Akerib | G06N 3/063 |
| 2019/0121837 A1* | 4/2019 | Azizi | G06N 3/02 |
| 2019/0179869 A1* | 6/2019 | Park | G06N 3/02 |
| 2019/0189174 A1* | 6/2019 | Hu | G11C 11/1659 |
| 2019/0236111 A1* | 8/2019 | Muralimanohar | G06F 17/16 |
| 2019/0237137 A1* | 8/2019 | Buchanan | G06F 17/16 |

OTHER PUBLICATIONS

Govindu, "Analysis of high-performance floating-point arithmetic on FPGAs", Apr. 26-30, 2004, IEEE (Year: 2004).*
Haron et al., "Parallel Matrix Multiplication on Memristor-Based Computation-in-Memory Architecture", IEEE, 2016 International Conference on High Performance Computing & Simulation, Jul. 18, 2016, pp. 1-8.
Hu et al., "Dot-Product Engine for Neuromorphic Computing: Programming 1T1M Crossbar to Accelerate Vector-Matri Multiplication", Hewlett Packard Labs, 2016 53nd ACM/EDAC/IEEE Design Automation Conference, Jun. 5, 2016, pp. 1-6.

International Search Report and the Written Opinion for International Application No. PCT/US2018/067889, entitled "Digital Architecture Supporting Analog Co-Processor" dated May 3, 2019.
Choi, B. J., et al., "Electrical Performance and Scalability of Pt Dispersed SiO2 Nanometallic Resistance Switch," Nano Letters, vol. 13, No. 7, pp. 3213-3217, Jun. 7, 2013.
Chua, Leon O., "Memristor—The Missing Circuit Element," IEEE Transactions on Circuit Theory, vol. Ct-18, No. 5, Sep. 1971.
Clarke, Peter, "Mixed Foursome Offers RISC-V Development Support," eeNewsAnalog, Nov. 30, 2016.
Hu, M., et al., "Dot-Product Engine for Deep Learning," Posters at ICCAD'15 Workshop on Hardware and Algorithms for Learning On-a-Chip, 1 page, Nov. 5, 2015.
Hu, M., et al., "Dot-Product Engine: Programming Memristor Crossbar Arrays for Efficient Vector-Matrix Multiplication," Posters at ICCAD'15 Workshop on Energy Efficient Computing in the Dark Silicon Era, 1 page, Nov. 5, 2015.
Indiveri, G., et al., "Integration of Nanoscale Memristor Synapses in Neuromorphic Computing Architectures," Nanotechnology, vol. 24, No. 38, 384010, 13 pages, Sep. 2, 2013.
International Preliminary Report on Patentability for Int'l Application No. PCT/US2017/016955, "Analog Co-Processor," date of issuance Aug. 14, 2018, 8 pages.
International Search Report and the Written Opinion of the International Searching Authority for Int'l Application No. PCT/US2017/016955, "Analog Co-Processor," dated May 26, 2017.
Kannan, S., et al., "Sneak-Path Testing of Crossbar-Based Nonvolatile Random Access Memories," IEEE Transaction on Nanotechnology, vol. 12, Issue 3, pp. 413-426, May 2013.
Kim, Y., et al., "A Reconfigurable Digital Neuromorphic Processor With Memristive Synaptic Crossbar for Cognitive Computing," ACM Journal on Emerging Technologies in Computer Systems, vol. 11, No. 4, pp. 38-1-38-25, Apr. 26, 2015.
Lal Shimpi, et al., "Nvidia's 1.4 billion transistor GPU," https://www.anandtech.com/show/2549/4, Jun. 16, 2008.
Shafiee, Ali , et al., "ISAAC: A convolutional neural network accelerator with in-situ analog arithmetic in crossbars," Proceedings of the 43rd International Symposium on Computer Architecture, ACM SIGARCH Computer Architecture Vews, vol. 44, Issue 3, pp. 14-26, Jun. 2016.
Shevgoor, Manjunath, et al., "Designing a Fast and Reliable Memory with Memristor Technology," University of Utah, HP Labs, 2 pages, Jan. 2016.
Strachan, J.P., "The Dot-Product Engine (DOE): exploring high efficiency analog multiplication with memristor arrays," Presentations at the 4th IEEE Rebooting Computing Summit (RCS4): Dec. 9-11, 2015, 29 pages, Dec. 11, 2015.
Wu, W., et al., "Sub-10 nm patterning using Nanoimprint lithography," Nanofabrication, Wei Wu Research Group, University of Southern Group, retrieved from the Internet URL: http://wugroup.usc.edu/research.php, Nov. 26, 2016.
Yang, J. J., et al., "High switching endurance in TaOx memristive devices," Applied Physics Letters, vol. 97, p. 232102, Dec 2010.

* cited by examiner ary arrangement. The controller interfaces with the VMM processor and may be configured to: a) retrieve read data from a memory, b) determine, based on the read data, a type of matrix multiplication to be performed, c) generate input matrices having a format specific to the type of matrix multiplication to be performed, d) determine a computational precision of the floating point VMM operation and parse the sign, exponent, and mantissa data fields from floating point elements of input matrices, and e) send the input matrix data to the VMM processor.

In response to the type being a general matrix-matrix (GEMM) multiplication, the controller may be further configured to 1) generate the input matrices according to a row-by-row sequence of the read data, and 2) apply the input matrices to an input of the VMM processor, wherein the VMM processor is further configured to apply the input matrices to the at least one memristor network. The input to the VMM processor may include a VMM signal-processing chain, the chain comprising digital logic blocks that perform a set of sequential functions to prepare floating point data for VMM, the functions including at least one of data formatting, exponent normalization/denormalization, and memristor network mapping/inverse mapping. In response to the type being a two-dimensional (2D) convolution and correlation, the controller may be further configured to 1) generate the input matrices as an overlapping sequence of the read data, the overlapping sequence representing a shift of a convolution operation, and 2) apply the input matrices to an input of the VMM processor, wherein the VMM processor is further configured to apply the input matrices to the at least one memristor network.

The controller may be further configured to a) identify an exponent of an extreme value of a floating point number retrieved from the read data; b) determine normalized exponents for other values of the floating point number as a function of the exponent, the other values being values other than the extreme value; c) modify the other values by replacing a respective exponent with a respective normalized exponent; and d) convert result data from the at least one memristor network to a floating point value based on the normalized exponents through a de-normalization process.

The controller may be further configured to a) identify a matrix to be stored into at least one memristor network; b) define mapping coefficients for the matrix based on 1) a high conductance state and a low conductance state of the at least one memristor network and 2) a highest value and a lowest value of the matrix; c) defining a map relating elements of the matrix to conductance values of the at least one memristor network based on the mapping coefficients; d) cause the VMM processor to store the matrix to the at least one memristor network as a function of the map, and e) convert result data from the at least one memristor network to numeric matrix values based on the map through an inverse mapping process.

The controller may be further configured to a) receive a plurality of instructions from a host processor's instruction cache based on the VMM operation to be performed, each of the plurality of instructions specifying configuration of an individual row of the at least one memristor network; and b) cause the VMM processor to execute the plurality of instructions in parallel via the at least one memristor network. The controller may be further configured to forward the plurality of instructions to the VMM processor as a very long instruction word (VLIW) instruction.

The controller may be further configured to a) identify, from the read data, column vectors to be written to the at least one memristor network; b) generate, for each of the column vectors, 1) an identifier representing a tier of a hierarchy of the at least one memristor network, and 2) a flag bit indicating whether to update a value corresponding to the column vector; and c) store the column vectors and respective identifiers and flag bits to the memory.

The controller may be further configured to a) identify, from the read data, matrix column vectors to be written to the at least one memristor network; b) perform a Gather operation on the matrix column vectors; such that i) matrix column vectors are stored across a collection of sub-banks of SRAM memory, potentially through DMA access from DRAM, and ii) matrix column vectors are read from SRAM memory into a request queue, then routed to designated Gather registers through a sub-bank address/data crossbar, and finally accessed by a VMM processor from associated Gather registers; c) map the matrix column vectors contained in Gather registers to conductance values of crossbars of the at least one memristor network of the VMM processor; and d) determine memristor weight values to program the at least one memristor network of the VMM processor based on the map. The controller may be further configured to a) read voltage outputs from the crossbars; b) map the voltage outputs to numeric matrix values; and c) store the numeric matrix values to memory through a Scatter operation; such that i) a VMM processor writes the values into an associated Scatter register, then routes these values through a sub-bank address/data crossbar to a designated request queue, and finally writes data into the intended sub-bank of SRAM memory; and ii) outputs may be written to DRAM memory, potentially through DMA access.

The controller may be further configured to a) retrieve, from the read data, vector input data values be written to the at least one memristor network; b) perform a Gather operation on the vector input data, such that i) vector input data is stored across a collection of sub-banks of SRAM memory, potentially through DMA access from DRAM, and ii) vector input data is read from SRAM memory into a request queue, then routed to designated Gather registers through a sub-bank address/data crossbar, and finally accessed by a VMM processor from associated Gather registers; c) map the vector input data values to crossbars of the at least one memristor network in the VMM processor; and d) determine memristor voltages to program the at least one memristor network of the VMM processor based on the map.

The controller may be further configured to a) identify a custom instruction from the read data, the custom instruction defining an operation associated with VMM; and b) cause the VMM processor to configure the at least one memristor network in accordance with the custom instruction. The custom instruction may include:

a) a load/store instruction to 1) program input values into memristor crossbar array rows and to program multiplicative weight values into the at least one memristor network within the VMM processor, and 2) store VMM output values from the at least one memristor network within the VMM processor into memory;

b) a VMM instruction to 1) define parameters including VMM floating point precision, 2) format and map VMM data into the at least one memristor network within the VMM processor, and 3) facilitate greater I/O bandwidth by amortizing per-operation control overhead through VLIW processing;

c) a bit manipulation instruction defining at least one of extraction, insertion, shifting, rotating, and testing of individual bits within the VMM processor's floating point registers, wherein instructions to manipulate mantissas, exponents, and sign bits are carried out within a larger process of a VMM signal processing chain; and/or d) a transactional memory instruction defining I/O efficiency and Scatter/Gather instructions, and further defining atomic operation of the custom instruction to facilitate coordination in reading/writing values into the at least one memristor network of the VMM processor.

The controller may be further configured to interface with a neural network system-on-chip (SoC), the controller being configured to a) comprise a pair of digital signal processors, such that i) one digital signal processor is devoted solely to I/O into and out of the at least one memristor network of the VMM processor, and ii) a second digital signal processor is devoted to digital architecture functions such as the VMM signal processing chain, memory management, non-linear operations, custom instruction processing, and calibration/compensation algorithms; b) interface to the neural network system-on-chip, such that i) the SoC is tasked with a neural network inference workload defined by a neural network model descriptor, and contains a set of kernel functions to be run on VMM processors, and ii) the model descriptor's kernel functions are compiled into custom instructions to be passed by the neural network system-on-chip through a high speed interconnect to the set of digital signal processors; and c) receive and process instructions through the set of digital signal processors to cause the VMM processor to execute the VMM functions.

The VMM processor and controller may be configured in a system-on-chip having a multi-layer stack of plural 2D integrated circuit (IC) layers, each of the plural layers including a subset of the at least one memristor network, each of the plural layers being linked by through silicon vias (TSVs).

In a further embodiment, a circuit may include a co-processor circuit comprising at one or more VMM cores configured to perform a VMM operation and supporting circuitry. Each of the VMM cores may include a) at least one array of VMM circuits, each of the VMM circuits being configured to compute a respective product on T-bit subsets of an N-bit total for the VMM operation, each of the VMM circuits comprising i) a signal generator configured to generate a programming signal based on at least one coefficient for the VMM operation; ii) a memristor network having an array of analog memristor devices arranged in a crossbar configuration; iii) a read/write control circuit configured to selectively enable read and write operations at the memristor network; iv) a memristor control circuit configured to selectively enable a selection of the analog memristor devices, the memristor control circuit including a column switch multiplexor, a row switch multiplexor, and an address encoder; v) a write circuit configured to set at least one resistance value within the network based on the programming signal, the write circuit including a voltage driver; vi) a read input circuit configured to apply at least one input signal to the memristor network, the input signal corresponding to a vector, the read input circuit including a voltage driver; and vii) a readout circuit configured to read at least one current value at the memristor network and generate an output signal based on the at least one current value. A read circuit array may be configured to convert at least one input vector into an analog signal to be applied to the memristor network. A write circuit array may convert at least one set signal, based on a multiplicative coefficient, to an analog set signal to be applied to the memristor network. An ADC array may convert at least one VMM analog output from the memristor network into digital values. A shift register array may be configured to format the digital values of the ADC array. An adder array may be configured to add outputs from the memristor network arrays, each of the adders performing a subset of a VMM operation associated with the multiplicative coefficient. A combiner may be configured to combine the output signal of each of the adder arrays to generate a combined output signal, the output signal of each adder array representing one of the respective products, the combiner being configured to aggregate the respective products into a combined output representing a solution to the VMM operation at floating point precision.

In a further embodiment, a circuit provides analog co-processing via vector-matrix multiplication (VMM). The circuit may include a signal generator, a memristor network, and supporting input/output (I/O) circuitry. The signal generator generates a programming signal based on at least one coefficient for VMM. The memristor network includes an array of memristors. A read/write control circuit may be configured to selectively enable read and write operations at the memristor network. A memristor control circuit may be configured to selectively enable a selection of the memristors, where the memristor control circuit may include one or more of a column switch multiplexor, a row switch multiplexor, and an address encoder. A write circuit may be configured to set at least one resistance value within the network based on the programming signal, where the write circuit may including a voltage converter/driver. A read input circuit may be configured to apply at least one input signal to the memristor network, the input signal corresponding to a vector, where the read input circuit may include a voltage converter/driver. A readout circuit may be configured to read at least one current value at the memristor network and generate an output signal based on the at least one current value.

In further embodiments, the memristor network may include a plurality of memristors arranged in a voltage divider configuration. The memristor network may further include an array of circuit elements, each of the circuit elements including a memristor in series with a transistor, the transistor configured to selectively enable current through the respective memristor.

In still further embodiments, the programming signal may be based on at least one discrete fourier transform (DFT) coefficient. The memristor network includes a plurality of subarrays of memristors, a first subarray of the plurality being applied to a real component of the DFT coefficient, and second subarray of the plurality being applied to an imaginary component of the DFT subarray. The input signal may have a voltage value being a function of the input vector intended for multiplication. The readout circuit may be further configured to generate the output signal as a VMM function of the result of the vector and programmed resistance values of the memristor network.

In yet further embodiments, the readout circuit may be further configured to detect currents at a plurality of nodes of the memristor network, where the output signal is a function of the currents. The readout circuit may further comprise an analog-to-digital converter (ADC) configured to output a digital value representing the output signal. The write circuit may be further configured to generate at least one analog set signal based on a multiplicative coefficient to set the at least one resistance value based on the programming signal, where the at least one analog signal is applied to the memristor network. A digital-to-analog converter (DAC) may be configured to generate the at least one analog set signal based on the programming signal.

In yet still further embodiments, a digital-to-analog converter (DAC) may be configured to generate the at least one input signal based on the vector. The readout circuit may further include a transimpedence amplifier configured to convert the output current to a voltage value, the output signal including the voltage value. The read circuit may be further configured to generate at least one analog input signal to multiply with at least one resistance value of the memristor network, the at least one analog input signal being applied to the memristor network.

Further embodiments include a co-processor circuit comprising an array of vector matrix multiplication (VMM) circuits, as well as supporting I/O circuitry. The array of VMM circuits may include one or more of the features described above, including a signal generator configured to generate a programming signal based on at least one coefficient for VMM and a memristor network. Further, a read DAC array may be configured to convert at least one input vector into an analog signal to be applied to the memristor network. A write DAC array may be configured to convert at least one set signal, based on a multiplicative coefficient, to an analog set signal to be applied to the memristor network. An ADC array may be configured to convert at least one VMM analog output from the memristor network into digital values. A shift register array may be configured to format the digital values of the ADC array. An adder array may be configured to add outputs from the memristor network arrays, each of the adders performing a subset of a VMM operation associated with the coeffieicent. A combiner may be configured to combine the output signal of each of the adder arrays to generate a combined output signal.

In further embodiments, a processor may be configured to generate the programming signal for each of the VMM circuits based on a mathematical operation. The mathematical operation may include an operation to solve at least one partial differential equation (PDE). The mathematical operation may also include at least one N-bit fixed-point computation, the VMM circuits configuring a plurality of the respective memristors to represent T-bit subsets of an N-bit total. The mathematical operation may further include at least one N-bit floating point computation, the VMM circuits configuring a plurality of the respective memristors to represent T-bit subsets of an N-bit total.

In still further embodiments, the at least one coefficient for VMM may correspond to a Discrete Fourier Transform (DFT). The array may be configured to process a 2D DFT by applying the at least one coefficient for VMM corresponding to a first 1D DFT to a first subset of the array, and applying the output of the first subset as the input to a second 1D DFT to a second subset of the array. The at least one coefficient for VMM may correspond to a Discrete Fourier Transform (DFT) to solve partial differential equations through spectral methods. Further, the at least one coefficient for VMM may correspond to a Discrete Fourier Transform (DFT) to perform range-doppler signal processing.

In yet further embodiments, the at least one coefficient for VMM may correspond to convolution coefficients to perform inference in a convolutional neural network. The at least one coefficient for VMM may corresponds to a Green's function representation to solve partial differential equations. The combiner may be further configured to interface with a Peripheral Component Interconnect Express (PCIe) host processor.

In still further embodiments, the at least one coefficient for VMM may correspond to a meshed Green's function representation to solve partial differential equations. The at least one coefficient for VMM may correspond to an energy minimization optimization problem solved through the conjugate gradient method. The conjugate gradient method may be configured to solve partial differential equations. The conjugate gradient method may be configured to perform a backpropagation algorithm within a neural network.

Further embodiments may include a method for performing VMM operations. A programming signal may be generated based on at least one coefficient for VMM. Read and write operations are selectively enabled at a memristor network having an array of memristors. A selection of the memristors are selectively enabled. At least one resistance value within the network may be set based on the programming signal. At least one input signal may be applied to the memristor network, the input signal corresponding to a vector. At least one current value at the memristor network may be read and an output signal may be generated based on the at least one current value.

Example embodiments provide include analog co-processors configured for solving partial differential equations (PDEs). Further, an analog Discrete Fourier Transform (DFT) can be implemented by invoking vector matrix multiplication (VMM) of input signals with Fourier basis functions using analog crossbar arrays. Linear and non-linear PDEs can be solved by implementing spectral PDE solution methods as an alternative to massively discretized finite difference methods, while exploiting inherent parallelism realized through the crossbar arrays. The analog crossbar array can be implemented in CMOS and memristors or a hybrid solution including a combination of CMOS and memristors.

BRIEF DESCRIPTION OF THE DRAWINGS

The foregoing will be apparent from the following more particular description of example embodiments, as illustrated in the accompanying drawings in which like reference characters refer to the same parts throughout the different views. The drawings are not necessarily to scale, emphasis instead being placed upon illustrating embodiments.

DETAILED DESCRIPTION

A description of example embodiments follows.

Figure 1:
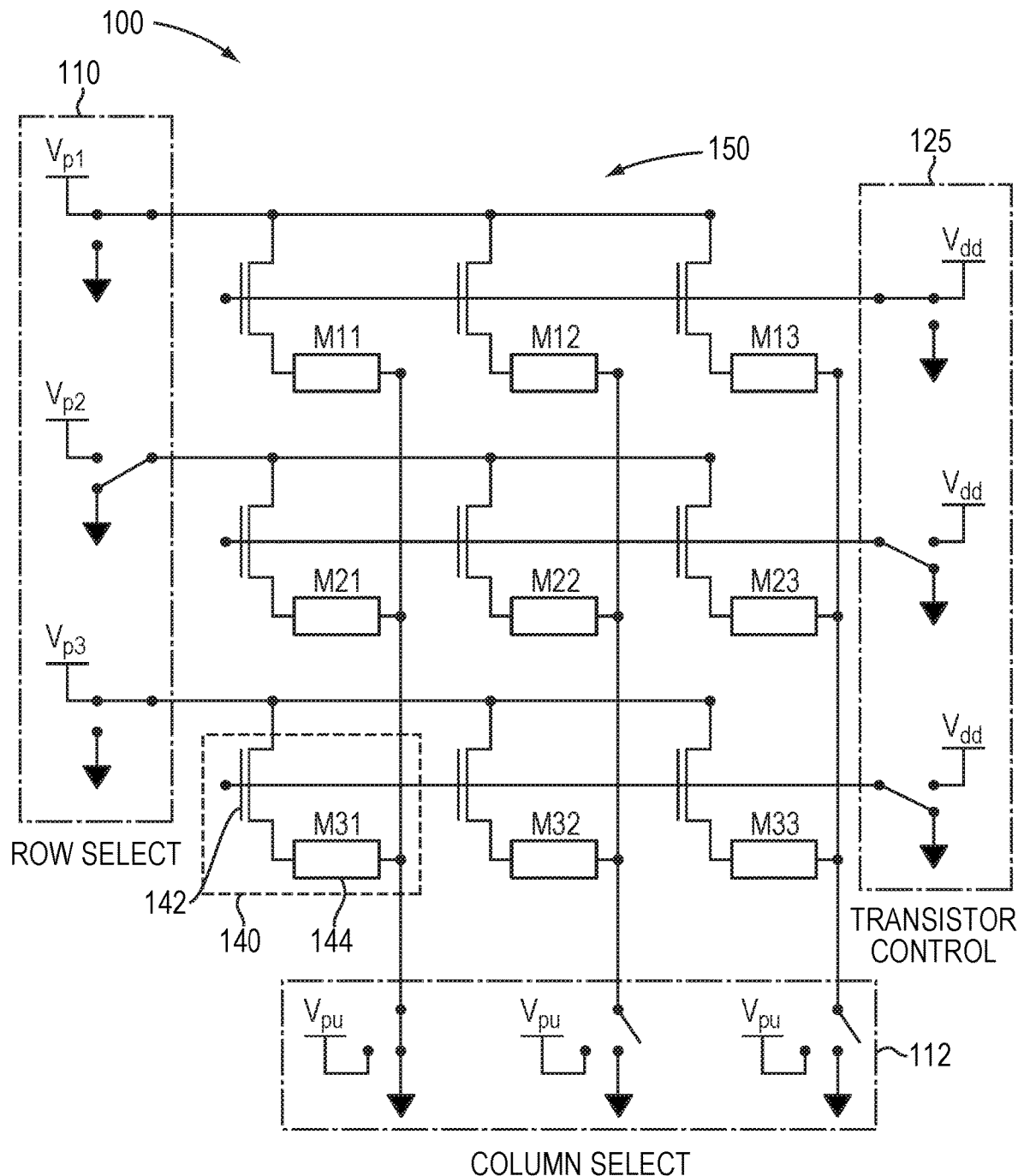
FIG. 1 is a circuit diagram of a transistor/memristor crossbar array that may be implemented in one embodiment.

FIG. 1 is a circuit diagram of a transistor/memristor crossbar network 100 that may be implemented in one embodiment. The network 100 includes a transistor/memristor array 150 (also referred to as a crossbar or crossbar array), which comprises a number of cells (also referred to as devices), including cell 140, arranged into rows and columns. The cell includes a memristor 144 connected in series with a transistor 142, where the transistor 142 selectively enables current through the respective memristor 144. The gate of the transistor 142 may be connected to a transistor control circuit 125 for controlling said current. Further, a row select circuit 110 and a column select circuit 112 selectively enable current through a given row and a given column of cells. The transistor control circuit 125, row select circuit 110 and a column select circuit 112 together enable a current to be applied to a selection of one or more cells of the array 150, while preventing current to unselected cells.

Memristor cross bar arrays, such as the array 150 of the network 100, may offer several beneficial features, such as high scalability, fast switching speed, non-volatility, large resistance ratio, non-destructive read, 3D stackability, high CMOS compatibility and manufacturability. However, the architecture can also have several application-dependent challenges. With regard to vector matric multiplication (VMM) in particular, achieving high device isolation in the crossbar array and obtaining acceptable analog behavior are substantial problems.

The operation of each memristor device in a memristor crossbar array affects the operation of other devices in close proximity. For example, a crossbar array may exhibit a phenomenon called "sneak path current," which is the sum of currents flowing through the unselected memristor devices. This phenomenon is reduced by using a selection device, which may be connected to each column or row of a crossbar array to drive memristive switching. The total current the selection device can drive may be determined by its channel width. However, a terminal selection device may have high nonlinearity in its current-voltage relation. This effect compromises the Ohm's law, and therefore a three-terminal selector (e.g. the transistor 142) may be used to mitigate the sneak path current issue and provide acceptable analog behavior, although transistor size limits the achievable memristor crossbar density. A transistor in series with a memristor device at each crosspoint, as shown in FIG. 1, may be called as 1T1M (or 1T1R) architecture. By controlling the current compliance of a memristor during ON switching, the resistance value of each cell 140 of the array 150 can be set to any target value between the high resistance state (HRS) and the low resistance state (LRS), which is referred to as analog behavior. In the 1T1M structure, the control of the current compliance can be readily realized by setting the gate voltage of the transistor at different levels. This enables programming of analog values in the memristor 144.

Figure 2:
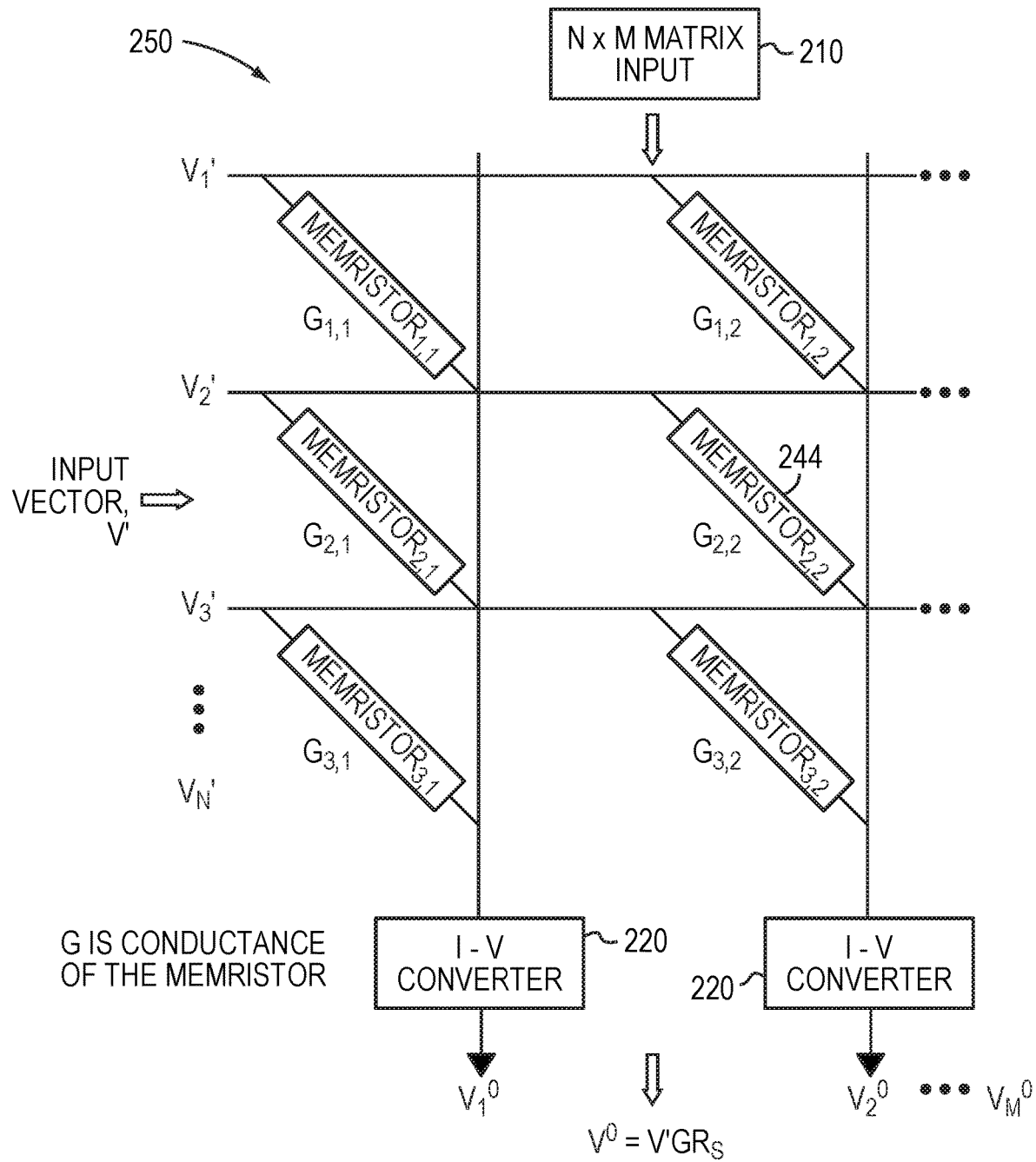
FIG. 2 is a circuit diagram of a memristor array.

FIG. 2 is a circuit diagram of a memristor array 250, which may include one or more features of the network 100 described above. In particular, the array 250 may include multiple rows ($V_1^1$-$V_N^1$) and columns ($V_1^O$-$V_M^O$) of memristors (e.g., memristor 244). Each memristor may also be configured with a selection device (e.g., a transistor) to form a cell such as the cell 140 described above.

Memristor crossbar arrays such as the array 250 can implement matrix-related computations, and can achieve more than 100× improvement in computing speed compared to a graphics processing unit ("GPU") or other accelerators due to the highly parallel computing model, efficient use of electrical signals, and laws of physics in the hardware implementation. The low operating energy (<pJ) of the memristor device further reduces the power consumption. The vector and matrix computations are executed through memristor crossbar arrays. As shown in FIG. 2, input voltages $V^1$ corresponding to an input vector are applied along the rows of an N×M array, which has been programmed according to an N×M matrix input 210. The output currents are collected through the columns by measuring output voltage $V^O$. At each column, every input voltage is weighted by the corresponding memristance ($1/G_{i,j}$) and the weighted summation appears at the output voltage. Thus, the relation between the input and output voltages can be represented in a vector matrix multiplication form $V^O$=−$V^1GR_s$ (negative feedback of op-amp), where G is an N×M matrix determined by conductances of the memristor crossbar array.

Device variability can be reduced by adopting superior switching materials (such as $TaO_x$ and $HfO_x$) and fabrication processes. Feedback circuits can be readily adopted in VMM applications to switch cells to target values. To provide a VMM operation, small voltages may be applied as inputs on the rows of the array 250, and the output currents or voltages on the columns may be measured. For example, an output current at each column may be read by converter circuit 220 and converted into a corresponding voltage. The applied voltages may remain lower than the effective switching threshold voltage of the memristor devices and, thus, do not induce any noticeable resistance changes in the adjoining ones. This operation may be referred to as a "memristor read," which can be repeatable with infinite endurance cycles and low error rates or imprecision. The more challenging, but less frequent VMM operations, are mapping a matrix on a memristor crossbar array, which requires programming (writing) resistance values into the memristor devices in the crossbar array.

Many applications in scientific computation, including solution of partial differential equations (PDEs), use floating point computation. An analog co-processor, in embodiments described below, supports vector-matrix multiplication in floating point format in addition to the fixed-point style computation described in the introduction and background section. Floating point is a representation of real numbers that trade-off between range and precision. In a floating-point representation, the number is represented by a fixed number of significant digits called the significand and scaled using an exponent in some fixed base. The general representation is of the form: significand×base$^{exponent}$. A variety of floating point representations have been used over the years, but since the 1990s the most commonly used floating point representation is as defined by IEEE754 standard.

The exponent for the 16-bit floating point is a 5-bit unsigned integer from 0 to 31. The actual exponent value used is the exponent value with a bias subtracted. The bias value for a 16-bit floating point representation is 15. So the effective value of the exponent ranges from −15 to 16. The true significand includes 10 fraction bits to the right of the binary point with an implicit leading bit. Only 10 fraction bits are stored in memory but the total precision is 11 bits. This corresponds to 3.311 decimal digits.

The exponent for the 32-bit floating point is an 8-bit unsigned integer from 0 to 255. The actual exponent value used is the exponent value with a bias subtracted. The bias value for a 32-bit floating point representation is 127. So the effective value of the exponent ranges from −127 to 128. The true significand includes 23 fraction bits to the right of the binary point with an implicit leading bit. Only 23 fraction bits are stored in memory but the total precision is 24 bits. This corresponds to 7.22 decimal digits.

The binary representation for the 16-bit floating point number may be given by the following equation:

$$(-1)^{b_{15}} \times (1.b_9 b_8 \ldots b_0) \times 2^{b_{14}b_{13}\ldots b_{10}-15}$$

This equation yields a decimal value of:

$$(-1)^{sign} \times \left(1 + \sum_{i=1}^{10} b_{23-i} 2^{-i}\right) \times 2^{e-15}$$

The minimum normalized positive value that can be represented using a 16-bit floating point representation is $2^{-14}=6.1\times10^{-5}$ and the maximum value is $(2-2^{-10})\times 2^{15}=65504$. The minimum normalized positive value that can be represented using a 32-bit floating point representation is $2^{-126}=1.18\times10^{-38}$.

Regarding floating point addition, two floating point numbers X and Y may be added. The significands of X and Y are denoted as $X_s$ and $Y_s$ and the exponential parts are denoted as $X_e$ and $Y_e$ respectively. The floating-point numbers can be added as follows: (a) Convert both numbers into scientific notation by explicitly representing the '1'. (b) In order to add these numbers, the exponents should be the same. This step is achieved by shifting the radix point of the mantissa. (c) Add the two mantissas. (d) Adjust the result and represent it as a floating-point number.

Regarding floating point multiplication, two floating point numbers X and Y may be multiplied. The significands of X and Y are denoted as $X_s$ and $Y_s$ and the exponential parts are denoted as $X_e$ and $Y_e$ respectively. The multiplication of X and Y is then given by:

$$X+Y=(X_s,Y_s)2^{X_e+Y_e-15}$$

In embodiments described below, floating point numbers may be handled by normalizing the exponents, which converts them into fixed point values with the mantissas aligned. Normalizing the exponents requires bit-shifting and padding, which are direct functions of the difference between the largest and smallest exponential values being handled. In some applications, the values can be as large as 278 bits for single precision floating point computation. To circumvent this problem, elements of each column of the VMM array may be aligned. This arrangement takes advantage of the fact that the difference between the exponents of the neighboring elements is significantly less than the extreme values. The same normalization procedure may be followed for the vector inputs that are used to multiply with the matrix values. The normalized exponent values of each column of the crossbar array can be stored, to be used during the de-normalization process, which converts the multiplied and accumulated results back to floating point precision.

Figure 3:
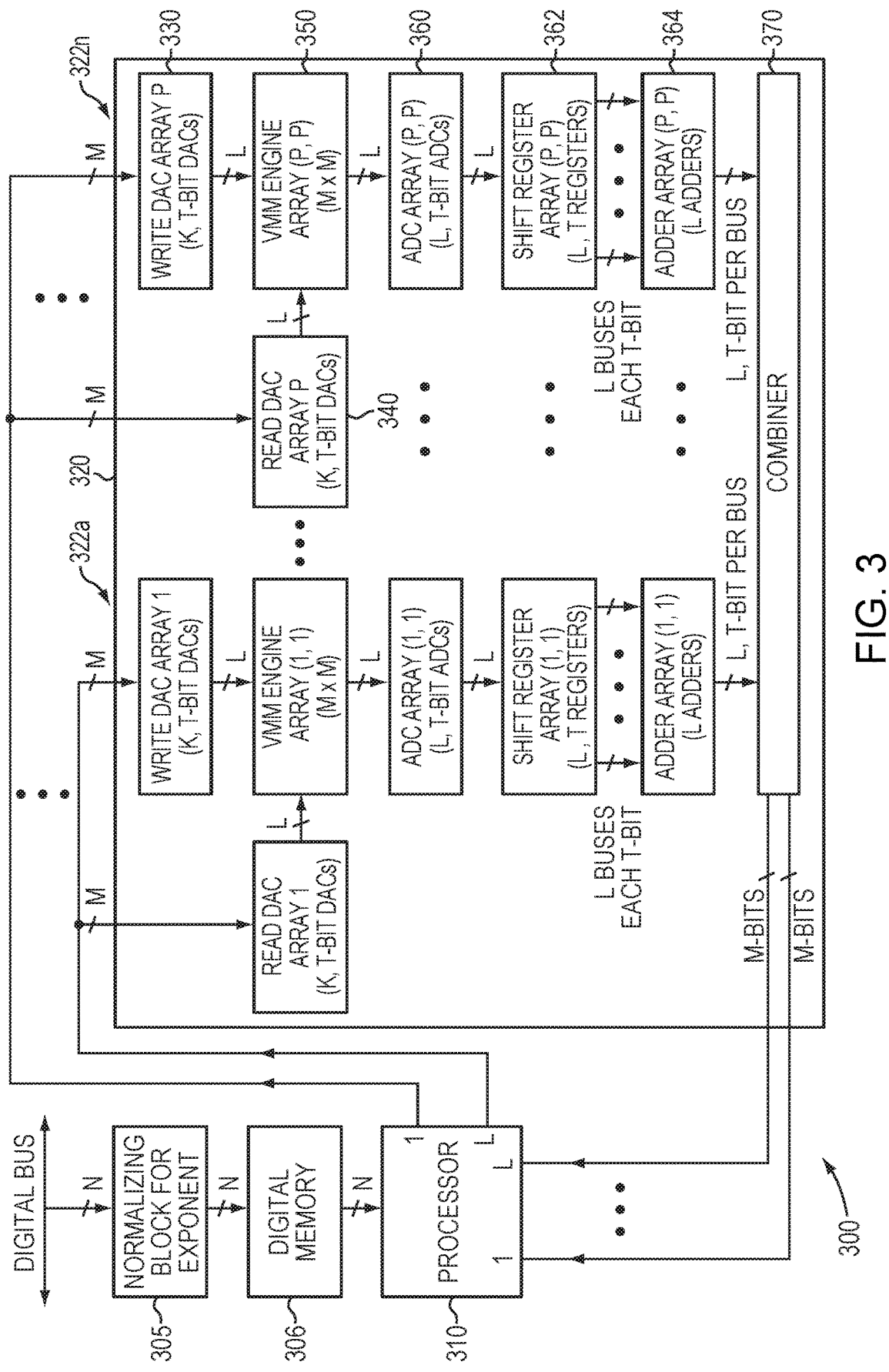
FIG. 3 is a block diagram of a system including a co-processor in one embodiment.

FIG. 3 is a block diagram of a co-processor 300 in one embodiment, which may be applied to perform computations such as N-bit floating point computations. The co-processor 300 may be referred to as an analog co-processor, as it implements analog circuitry (e.g., one or more memristor networks) to perform computations as described below. The data required for the computation may be received from a digital data bus (e.g., a PCIe bus) to a normalizing block 305 for exponents, which normalizes blocks of data by making their exponents the same. These normalized values may be stored to an on-chip digital memory 306, which is accessed through a N-lane bus by a processor 310. The processor 310 interfaces with a VMM core 320. The VMM core 320 may operate as the computational core of the co-processor, and may be made of up an array of P×P VMM engines. For clarity, two lanes 322a, 322n of such an array are shown. A given lane 322n may include write and read digital-to-analog converters (DACs) 330, 340, a P×P VMM engine array 350, an analog-to-digital converter (ADC) array 360, a shift register array 362, and an adder array 364. Each VMM engine (e.g. engines of the VMM engine array 350) may include an M×M memristor crossbar array (e.g., arrays 150, 250 as described above), as well as respective read and write circuitry along with the row and column multiplexers, which are used to address the memristors for read and write operations. An example VMM engine is described in further detail below with reference to FIG. 5.

Figure 4:
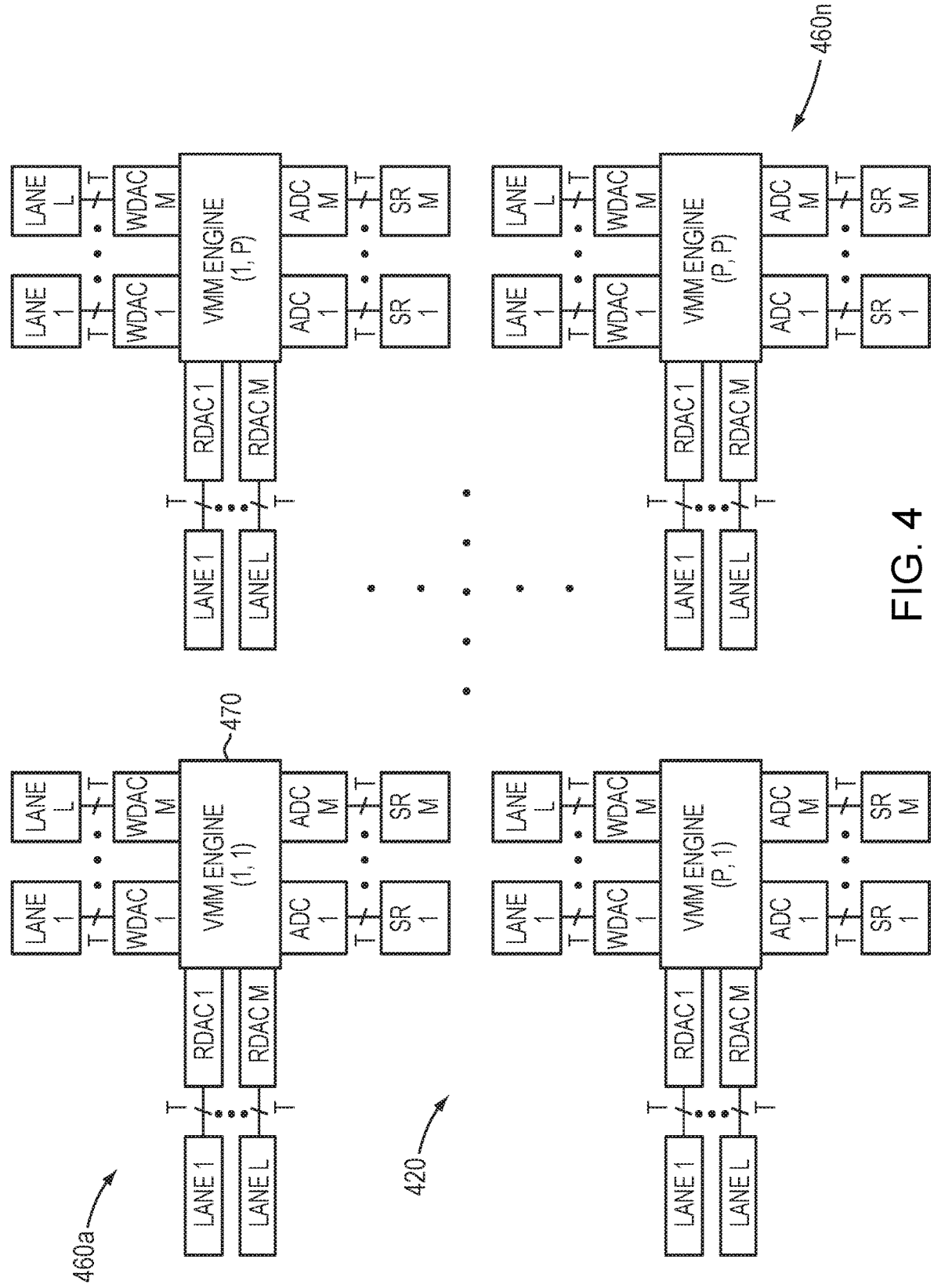
FIG. 4 is a block diagram of an array of vector matrix multiplication (VMM) engines that may be implemented in the co-processor of FIG. 3.

FIG. 4 is a block diagram of an array 420 of vector matrix multiplication (VMM) engines (e.g., VMM engine 470) that may be implemented in the VMM core 320 of the co-processor 300 of FIG. 3. Each of the VMM engines 470 may be connected to respective DACs and ADCs to form individual cells 460a-n of the array.

Figure 5:
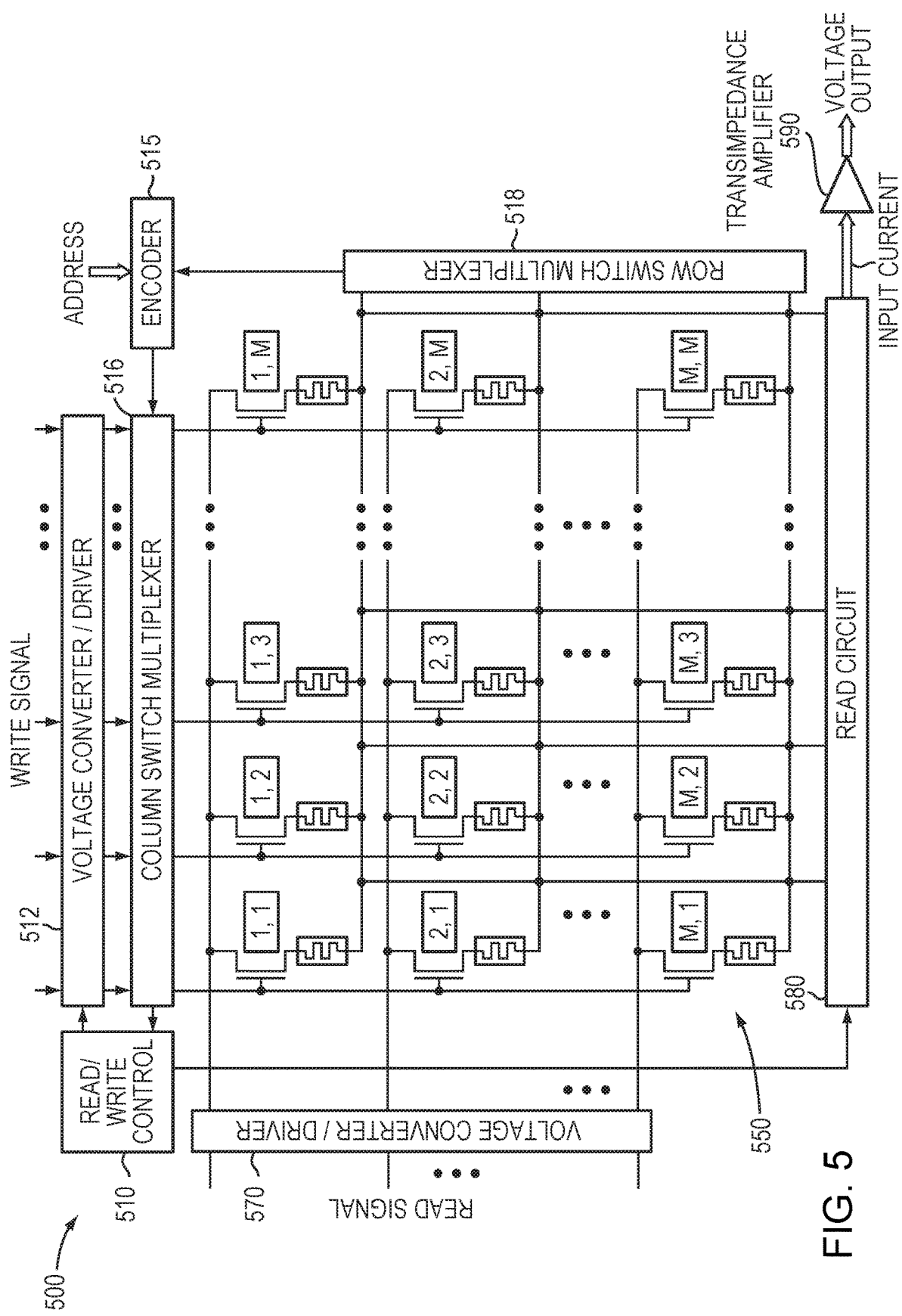
FIG. 5 is a block diagram of a VMM engine in one embodiment.

FIG. 5 is a block diagram of a VMM engine 500. The VMM engine 500 may be implemented as an engine of the VMM engine array 350 of the VMM core 320 of the co-processor 300 of FIG. 3, and may be implemented as a VMM engine 460 of the array 420 of FIG. 4. The VMM engine 500 may include a memristor network 500 having an array (1,1-M,M) of memristor cells comprising a switch and a memristor connected in series, and may include one or more features of the memristor network 100 and array described above with reference to FIGS. 1 and 2. The VMM engine further includes circuitry to program the memristor network 550 by setting resistance values of the memristors in the network 550 (also referred to as a "write operation"), and circuitry to apply an input signal to the programmed memristor network 550 and detect a resulting current and/or voltage (also referred to as a "read operation").

In particular, a read/write control circuit 510 may selectively enable read and write operations. For a write operation, a voltage converter/driver 512 may receive a programming signal ("write signal") and generate a corresponding signal (e.g., a voltage value) for setting resistance values of the memristor network 550. A column switch multiplexer 516 and a row switch multiplexer 518 enable selection of one or more of the memristor cells of the array 550. An encoder circuit 515 converts an address signal into signals indicating a subset of the memristor cells for selection by the multiplexers 516, 518. For a read operation, a voltage converter/driver 570 may receive a "read signal" indicating a vector and apply a corresponding set of input signals to the memristor network 550. A readout circuit 580 may then receive and combine the resulting current through the memristor network 550, and a transimpedance amplifier 590 may receive the resulting current and generate an output signal having a voltage value based on the current.

Operation of a co-processor and respective VMM engines, in example embodiments, are described below with reference to FIGS. 3-5.

Write Operation

Referring again to FIG. 3, in order to enable the co-processor 300 to perform a computation, the respective VMM engines may undergo a write operation, which may set the resistance values of the memristors of the VMM engines. The write DAC array 330, in particular, may write the matrix values into the memristors of the VMM engine array 350. Because the size of each VMM engine 500 is M×M, the number of write DACs per VMM engine may also be M. Each write DAC 330 writes T-bits into each memristor, and one entire row may be written in a single clock cycle. The write DAC array 330 may utilize the write circuitry of each VMM engine 500 (FIG. 5) to write into the memristors of the engine memristor array 550.

Because the exponents have been normalized (e.g., by the normalizing block 305), only the mantissas may require handling by the co-processor 300. An N-bit floating point number has M mantissa bits. Hence, P VMM engines in each row may be required to handle the M bits at T-bits per cell. For example, the first memristor of VMM engine "1" (e.g., engine 500) may store the T MSB bits, and the first memristor of VMM engine "P" stores the T LSB bits. The other (P−1) rows of the VMM engines may have the same values being written into them. Each write DAC 330 may have a T-bit input from each lane of the processor 310. This T-bit digital data may be converted into a single analog value, which is stored as a memristor conductance state. Each row of the VMM engine 500 may be written in a single clock cycle. Given a memristor write time of 4 ns, for example, then a M×M crossbar may require M*4 ns to write all the values. The write operation can be considered an overhead because the VMM operation cannot begin until all the memristors have been written into. In order to avoid this overhead, an interleaved approach may be used where two VMM cores will be operated in an interleaved manner.

Read Operation

Once all of the memristors of the network 550 have been written, the VMM engines of the VMM core 320 can be used to perform the read operation (a VMM operation). As shown in FIG. 3, each VMM engine array 350 has its own read DAC array 340. Each DAC of the array 340 may be T-bits wide and inputs a T-bit value into each row of the memristor crossbar array. Because the size of the VMM engine is M×M, the number of read DACs in each array is also M. The read and the write operations may be sequential and, hence, the same M lanes may be used for both the read and write operations. The read DACs 340 may be used to input a vector into the memristor crossbar arrays of the VMM engine array 350. The read DACs may provide an input vector to multiply with the matrix values stored in the memristor crossbar array. Because the input vectors are also N-bit floating point numbers, the mantissa is M-bits wide. Each DAC 340 has a T-bit input as shown in the figure. Thus, the computation requires [P=(M/T)] columns of VMM engines to handle the M mantissa bits. The T-bit digital data may be converted into a single analog value. Each column of the VMM engines may receive the same input vector through the read circuitry 570 (FIG. 5). The resulting VMM outputs along each column can be read out using the readout circuit 580.

The analog outputs of each VMM engine 500 may be digitized using column parallel ADCs 360 as shown in FIG. 3. Each ADC may be T-bits wide, and each VMM engine 500 may have M ADCs. The analog co-processor 300 may handle M-bit mantissa of the N-bit floating point number, but each memristor may store only T-bits of information. Hence, the M-bit mantissa may be broken down into M/T pieces of T-bit numbers. After the VMM operation has been performed and the outputs have been digitized, the bits can be shifted to their correct bit positions. For this purpose, shift registers 362 may be implemented at the output of each ADC 360. Each shift register array 362 may have a different bit shift setting. After the bits have been shifted, the outputs of each column of the VMM engine 500 may be added to the corresponding columns by adder array 364. Each adder of the array 364 may have P inputs from the P VMM columns in each row. Similarly, the columns of the other VMM engines may also be added together using the adders of the array 364. Each row of the VMM core 320 may have a set of P adders of the adder array 364. The outputs of the adders 364, which are T-bits long, may be combined using a combiner 370 to form an M-bit mantissa output. These outputs may be stored to an on-chip digital memory 306 and transmitted across the digital bus.

Figure 6:
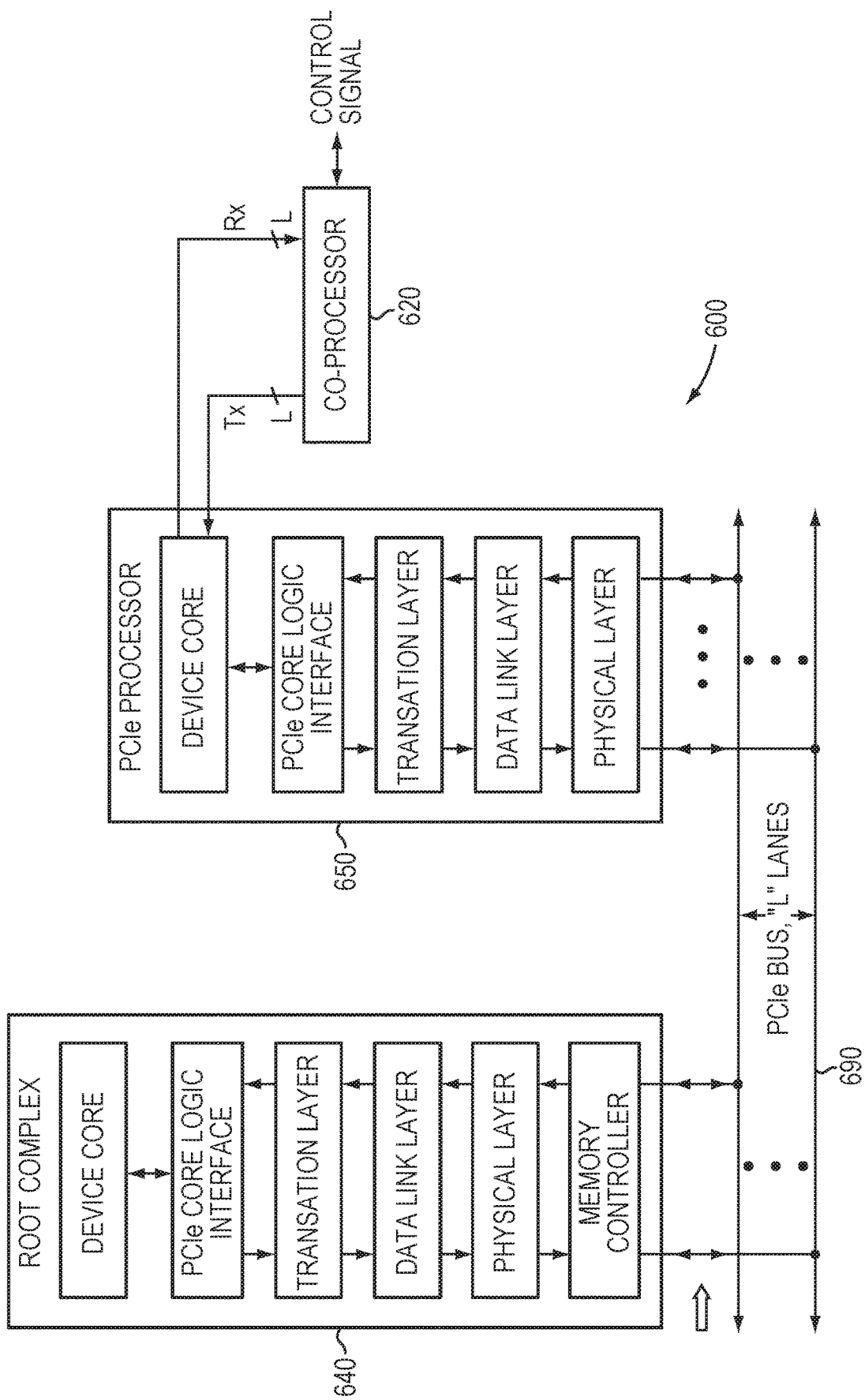
FIG. 6 is a block diagram of a Peripheral Component Interconnect Express (PCIe) architecture in which an embodiment may be implemented.

FIG. 6 is a block diagram of a Peripheral Component Interconnect Express (PCIe) architecture in which an embodiment may be implemented. PCIe is a serial point-to-point interconnect topology to connect peripherals in computing and communication platforms. A PCIe 'lane' comprises two simplex interconnect links between two PCIe devices, each in opposite directions. The PCIe standard offers the flexibility of increasing throughput by adding lanes between devices. PCIe version 3.0, for example, permits simplex lanes to be added in increments of 1, 2, 4, 8, 12, 16 and 32. The number of lanes, denoted by may affect the size and performance of a co-processor interfacing with devices under a PCIe architecture.

As illustrated in FIG. 6, a CPU chipset 640 and a PCIe processor host 650 are communicatively coupled via a PCIe bus 690. The PCIe host processor 650, in turn, may communicate with a co-processor 620, which may include features comparable to those of the co-processor 300 described above. In operation, the CPU chipset 640 may be transmitting to the co-processor 620. Data payloads may be created at the device core of the chipset 640 and are sent to three layers (transaction layer, data link layer, and physical layer) where overheads are appended to ensure reliable delivery of the packets in the correct sequence to the corresponding layer in the PCIe processor 650. The constructed packets may then be presented to the memory controller of the chipset 640, which is physically connected to the PCIe bus 690 and determines a lane on which to insert the packets. As the packets flow from the physical layer to the transaction layer in the PCIe controller 650, each layer strips off its overhead and reliable data payload is delivered in the right sequence to the device core. The PCIe processor 650 host deconstructs the packet and delivers the payload to the co-processor 620.

Similarly, the PCIe processor host constructs the packets from the data payload created by the co-processor 620 and sends them reliably and in the correct sequence to the device core in the CPU chipset 640. The function of the PCIe processor can be implemented, for example, in a Xilinx FPGA, communicating with the CPU chipset 640 and controlling and programming the co-processor 620. Provisions of the PCIe protocol may be implemented to control and program the co-processor 620. Additionally, "out of band" control and programming of the co-processor 620 can be performed in a software program such as MATLAB residing, for example, in a host workstation.

Figure 7:
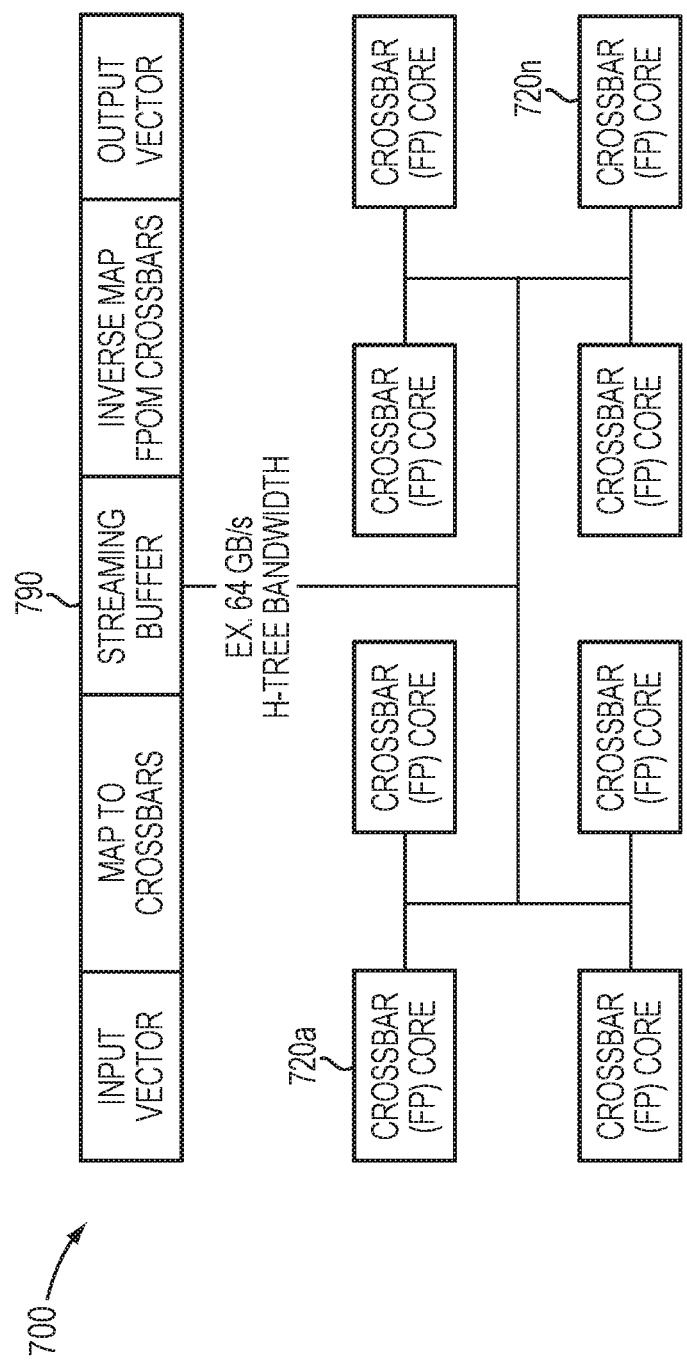
FIG. 7 is a block diagram of an H-tree architecture in one embodiment.

FIG. 7 is a block diagram of an H-tree architecture 700 in one embodiment. As described above, P×P parallel arrays of M×M crossbars can perform floating point operations. For a single precision computation, P is 6 and M is 32. Such a configuration (36 sets of 32×32 crossbars with 4 bits/cell for 32-bit floating point, or 4 sets of 32×32 crossbars with 5 bits/cell for 16-bit floating point) can be termed a "crossbar core," or "floating point core." Using an interface, such as a PCIe 4.0 interface, with 32 lanes enables 32-element input vectors to be fully input to the co-processor's floating point cores at 64 GB/s of bidirectional bandwidth. PCIe values may be aggregated as an input vector and mapped to specific crossbars for computation, which may be done on an FPGA.

The H-tree architecture 700 may include a plurality of crossbar cores 720*a-n* connected in an H-tree configuration to a common interface. Using a streaming buffer 790 to feed an H-Tree network of 8 such cores at 64 GB/s of H-Tree bandwidth yields 1 PB/s (250 TFLOPs single precision) of VMM computation (16 GT/s of 32-bit inputs*8 floating point cores*2016 floating point computations per core). Outputs of the floating-point cores may then be inversely mapped back to their corresponding input vector components and aggregated as an output vector to be returned to the sending device, which may also be done on an FPGA. The crossbar cores 720*a-n* of the H-tree architecture 700 may be configured to interface directly with the PCIe bus, avoiding the bandwidth asymmetry that can be present in processor-in-memory architectures that attempt to create internal device bandwidth at the TB/s scale.

Example embodiments described above provide an analog co-processor for applications requiring high computational speed and low power consumption. The co-processor is capable of solving partial differential equations arising in the scientific simulation of complex systems. Current PDE solution methods within scientific simulation are inefficient and often intractable due to limitations associated with discrete variable encoding and serial processing. Embodiments described above implement a set of PDE solution procedures by invoking vector matrix multiplication of input signals with multiplicative coefficients using the analog behavior of CMOS-memristor crossbar arrays.

Example embodiments may solve linear and non-linear PDEs by implementing spectral and Green's function solution methods as an alternative to massively discretized finite difference methods, while exploiting inherent parallelism realized through crossbar arrays. In the spectral method, an analog crossbar architecture may be used to convert PDEs into the Fourier domain. Once expressed in the Fourier domain, VMM and integration may be performed using the crossbar to arrive at a solution to the PDE by exploiting the Inverse Discrete Fourier Transform (IDFT) and the convolution theorem. Thus, partial differential equations of interest can be mapped to the analog crossbar Discrete Fourier Transform ("DFT") architecture, resulting in dramatically simpler Fourier expressions that increase the speed of PDE solution computation well beyond previous methods. Linear PDEs with far-reaching applicability, such as wave and heat equations, are solved in this fashion. Solutions to non-linear PDEs through linearization followed by Fourier domain representation, and the Navier-Stokes equations for incompressible fluid flow, are example applications.

A further method of solution to PDEs is the Green's function method. The Green's function method may not be feasible for solving a PDE on a traditional computer. However, embodiments described above, implementing circuitry such as memristor-CMOS crossbar, provide means for PDE solutions. A PDE has a formal mathematical solution that involves the Green's function:

$$T(x) = \int_\Omega G(x,x')S(x')dx'$$

where $G(x,x')$ is the Green's function. Every PDE has a particular Green's function. If the integral over the domain is approximated on a discrete mesh with N mesh cells per elements, then calculating the solution $T(x)$ in one cell requires summing over all the (N−1) other cells and solving for all the solution unknowns (in all the cells) requires order $N^2$ operations. Such an operation is computationally expensive because it is possible to find the solution to this problem in $O(N)$ time. For this reason, the Green's function is rarely used as a primary solution technique for solving PDEs in prior approaches.

The computational cost can also be understood in terms of linear algebra and matrices. Once discretized, a PDE produces a matrix problem Ax=b, where A is an N×N sparse matrix with only $O(N)$ non-zero entries, b is a source vector of N known values, and x is the unknown solution vector (with N entries). The Green's function, $G(x,x')$ is the equivalent of the matrix inverse. It is a full matrix and requires $N^2$ operations to multiply by the source and get the solution, via $x=A^{-1}b$.

Example embodiments described above make the Green's function approach viable again, as they perform the matrix multiplication operations in the analog domain. As a result, all the $N^2$ operations of a vector times a full matrix multiply (VMM) can be performed in a single cycle on a memristor crossbar array.

Such embodiments also applicable to Convolutional Neural Network (CNN)-based image recognition and Doppler filtering. CNN is an increasingly popular machine learning tool for object detection and recognition tasks. However, state-of-the-art embedded digital solutions require considerable power to perform typical CNN tasks (e.g., tasks on the AlexNet benchmark), failing to achieve real-time video operation or meet mobile device power budgets. Prior PDE solution techniques also involve GPUs, and face similar problems in computing efficiency. Further applications include Range-Doppler signal processing in radar systems. Significant reduction in size, weight and power (SWaP) of these platforms is required for signal processing in swarm intelligence and related applications, where real-time operation at power consumption of less than 1 W may be required.

Example embodiments described above, by utilizing features such as analog crossbar VMM, can enable such applications under the above constraints.

Example embodiments can be implemented via CMOS and emerging nanotechnologies such as memristor or a hybrid technology consisting of both CMOS and memristor. Such an implementation provides a number of advantages in analog DFT realization, as an analog crossbar processor as described above can program the DFT coefficients and perform vector matrix multiplication with the input signals. In particular, an analog processor as described above can implement analog Discrete Fourier Transforms more than 1,024 points with 2 to 3 orders of magnitude improvement in computing speed and power consumption over digital system, with sufficient parallelization of base size crossbar arrays.

Computing Systems Incorporating a Co-Processor

Figure 8A:
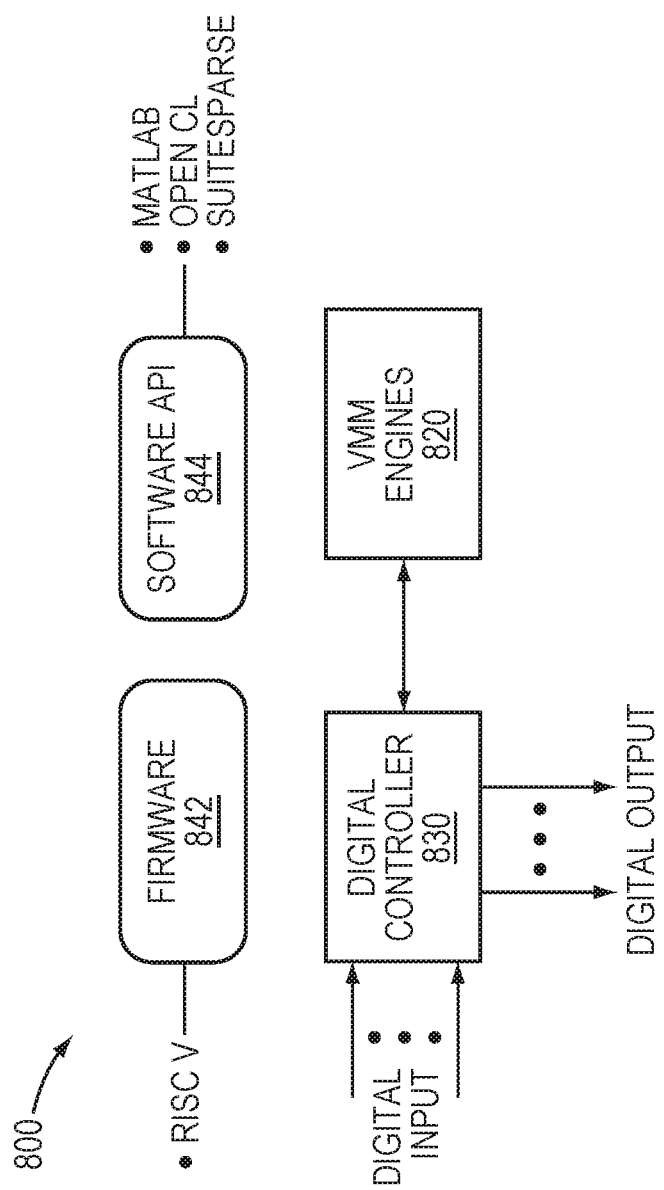
FIGS. 8A-B are block diagrams of a computational system in one embodiment.

FIG. 8A is a block diagram of a computational system 800 in one embodiment, which can be applied to perform computations such as N-bit floating point computations. The system 800 includes a VMM processor comprising VMM engines 820, which may be configured to include one or more VMM engines such as the VMM engine 500 described above with reference to FIG. 5. The VMM engines 820 may be configured in one or more of a variety of architectures as described above, such as the array 420 of FIG. 4 or the H-Tree architecture 700 of FIG. 7. The VMM engines 820 may also be configured as a VMM core including a structured array of VMM engines and supporting circuitry, such as the VMM core 320 of FIG. 3. In any of the above configurations, the VMM engines 820 may be referred to as a VMM processor. The VMM engines 820 interface with a digital controller 830.

Figure 8B:
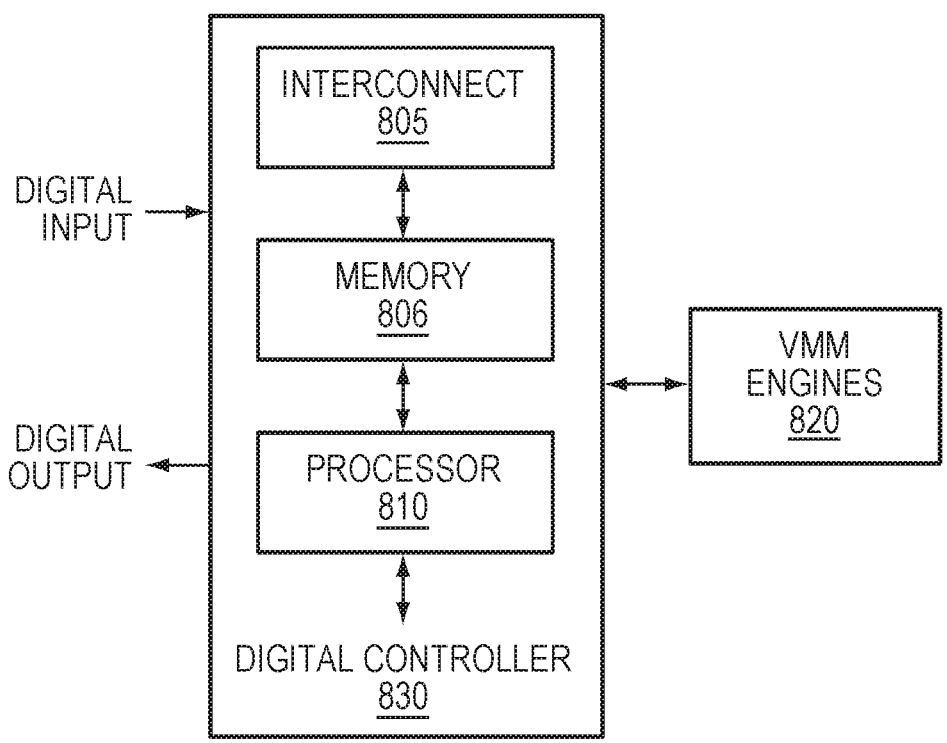

FIG. 8B illustrates the digital controller 830 in further detail. The digital controller 830 may include an interconnect 805, a memory 806, and a processor 810, which may incorporate features of the components 305, 306, 310 described above with reference to FIG. 3. Thus, the digital controller 830 and VMM engines 820 may be configured as a co-processor such as the co-processor 300 described above with reference to FIG. 3. To perform computations such as N-bit floating point computations, the required data may be received from a digital data bus (e.g., the PCIe bus 690 via the PCIe processor 650 as shown in FIG. 6) to the interconnect 805, which forwards the data to the processor 810. The processor 810 may normalize blocks of data to generate normalized values. These normalized values may be stored to the memory 806, which is accessed by the processor 810. The processor 810 interfaces with the VMM engines 820, controlling the VMM engines 820 to perform read and write operations as described above with reference to FIG. 5. Computation results following such operations may be processed by the digital controller 830 and reported to a host device (not shown) requesting the results, such as the CPU chipset 640 of FIG. 6.

Thus, the system 800 can provide for performing computationally-intensive operations, such as VMM operation, a collection of multiply-accumulate (MAC) operations, in the analog domain using the VMM engines 820. The system 800 may further provide a VMM signal-processing chain for processing data VMM engines 820, enabling floating point computation, as well as management of data movement to and from the memory 806, and command and control techniques through an instruction set architecture (ISA). These solutions can be implemented in firmware 842 of the controller 830, for example as extensions to the RISC-V open source ISA. Computing instructions to the VMM engines 820 may be translated by the controller 830 from function calls to a software application programming interface (API) 844, including compatibility with Matlab, OpenCL, SuiteSparse, and/or other software applications.

Figure 9:
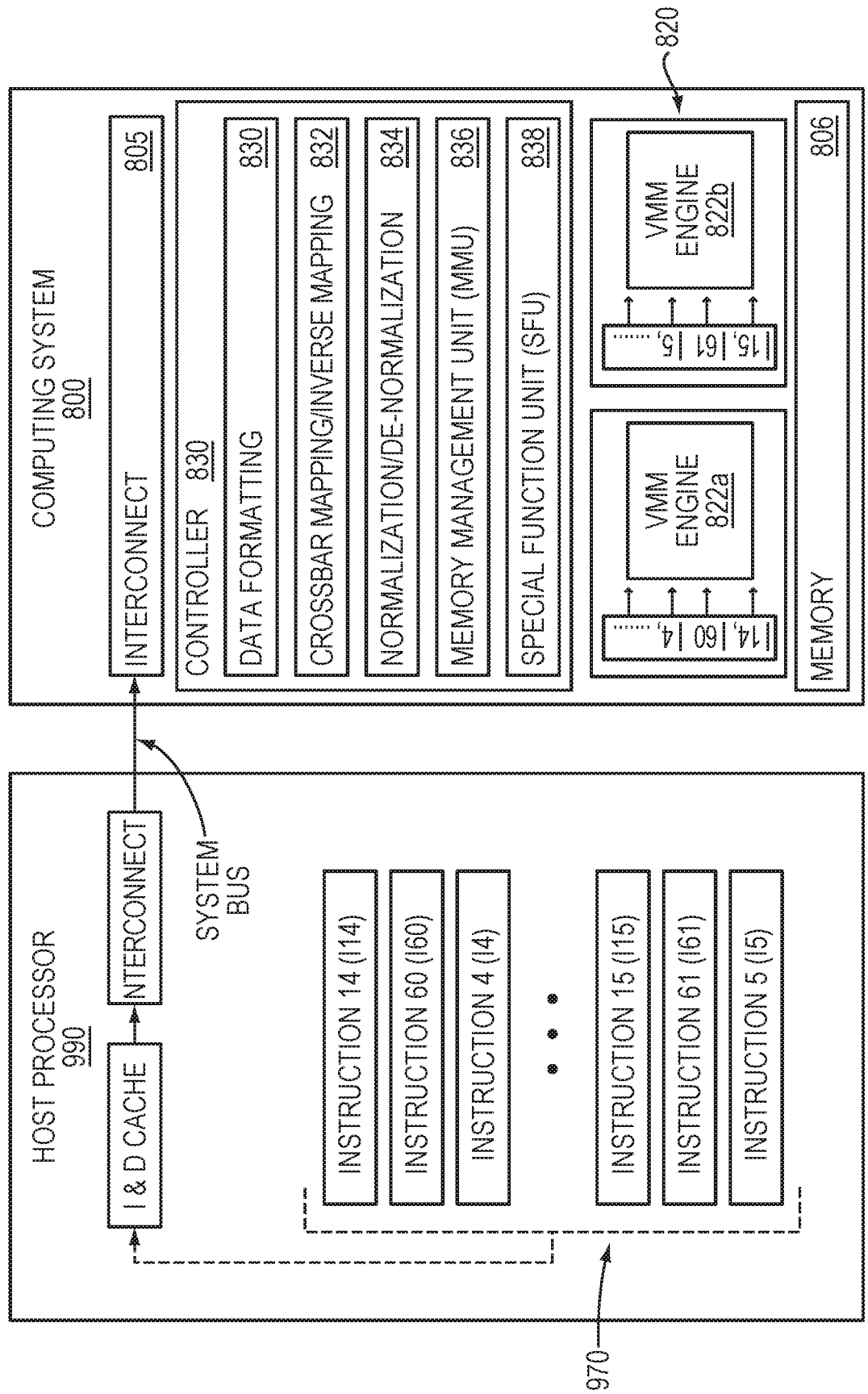
FIG. 9 is a block diagram of the computational system in a further embodiment.

FIG. 9 illustrates the computing system 800 in further detail, and in a configuration coupled to a host processor 990. The interconnect 805 may be communicatively coupled to the host processor 990 via a system bus (e.g., a PCIe bus), and receives a set of instructions 970 from the host processor 990. The controller 830 may implement a VMM signal processing chain to process the instructions 970 and generate corresponding commands to write to and read from the VMM engines 820 (e.g., VMM engines 822a-b). The VMM signal processing chain of the controller 830 may include a data formatting block 830, a crossbar mapping/inverse mapping block 832, a normalization/de-normalization block 834, a memory management unit (MMU) 836, and a special function unit (SFU) 838. Each of these blocks is described in further detail below.

The digital controller 830 can implement several features for interfacing with the host processor 990 and the VMM engines 820, including the following:

a) The memory 806 can manage the flow of data into and out of the crossbar architecture of the VMM engines 820 to maximize I/O bandwidth to the co-processor.

b) The digital controller 830 may process the complete VMM signal processing chain, including floating point computation. This chain may include specialized digital blocks for data formatting to enable computation of general matrix-matrix multiplication, vector-matrix multiplication and 2D convolution/correlation operations in the analog domain, as well as performing mapping/inverse mapping of data onto crossbar arrays, and normalization/de-normalization of exponents associated with floating point computation.

c) ISA extensions can be optimized to perform VMM in memristor crossbar arrays, and integration into the host processor 990.

d) The digital controller 830 may also perform additional computation than that described in (b) to minimize memory access and improve computational efficiency. The types of digital computation are determined by the various applications implemented in the analog co-processor and can be categorized as special functions, to be processed by a special function unit in the digital engine.

VMM Signal Processing Chain

The controller 830 may implement the VMM signal processing chain to supports the memristor-CMOS crossbar array of the VMM engines 820 in accelerating VMM operations for various applications. The chain may include the following blocks:

Data Formatting Block 830: Many applications that will be run on the computing system 800 either perform a general matrix-matrix multiplication operation or a 2D convolution/correlation operation. In the case of a matrix-matrix multiplication, the controller 830 may cause the VMM engines 820 to write one of the matrices into its memristor-CMOS crossbar array as corresponding conductance values, and the other matrix is multiplied row-wise using the written memristor-CMOS crossbar array such that each matrix row is the input vector for vector-matrix multiplication. In the 2D convolution case, an additional shift and add operation may be required along with a matrix multiply. Here, the processor 806 may read out the second matrix from the memory 806 using a processor in an overlapping sequence to represent the shift required for a convolution operation before being applied to a memristor crossbar array of the VMM engines 820. The VMM outputs at the end of each memristor crossbar array column of the VMM engines 820 may then be summed to obtain the final 2D convolved result. The application layer, which may be implemented by the processor 810 or another component, can distinguish which of the two major classes of matrix multiplication operation is to be processed by the analog co-processor in a given instance.

Normalizing and De-normalizing Block 834: Different applications being implemented by the system 800 may require different levels of precision and dynamic ranges. To accommodate this, the floating-point format may be used. The system 800 may represent floating point values by a number (mantissa) raised to a power (exponent), with a preceding sign bit. The system 800 may handle floating point numbers are handled by normalizing the exponents and aligning the mantissas. This normalizing may be more efficient when performed on a set of values.

To perform this normalizing and aligning, the controller 830 may first identify the exponent '$E_{max}$' of the extreme value. Other values may then be normalized to have the same exponent $E_{max}$ by bit-shifting them by a factor ($E_{max}$-E-Bias), where E is the exponent of each individual value and the 'Bias' term is a constant for a particular bit precision (e.g. Bias is 127 for a 32-bit floating point number). In a worst case, the normalizing factor can be as large 278 bits for single precision floating point computation. To circumvent this problem, the controller 830 may cause elements within each cell of the VMM engines 820 to be aligned. This solution takes advantage of the fact that the difference between the exponents of the neighboring elements is significantly less than the extreme values. The normalized exponent values of each cell of the analog co-processor may be stored to the memory 806, to be used during the de-normalization process, which converts the multiplied and accumulated results back to floating point precision. The controller 830 may implement digital logic blocks to perform the normalization and de-normalization procedure required to handle floating point numbers as part of the VMM signal processing chain.

Mapping and Inverse Mapping Block 832: The first step of performing a VMM operation is to store the matrix values in the memristor crossbar array as conductance of the memristors. The memristors have high conductance state ($Y_{max}$) and a low conductance state ($Y_{min}$). Let the matrix to be mapped into the memristor crossbar array be A. The highest and the lowest values of the matrix are first identified as $A_{max}$ and $A_{min}$. Two linear mapping coefficients are then defined as:

$$a = \frac{Y_{max} - Y_{min}}{A_{max} - A_{min}} \text{ and } b = Y_{max} - a(A_{max})$$

Using these two coefficients, the elements of the matrix A are mapped to the memristor conductance values as Y=a.A+b. This mapping works for negative numbers as well. After the elements of the matrix have been converted into memristor conductance values, these are further converted into write voltages for the memristors. These write voltages are used to store the conductance values in the memristor. The input vector values are also linearly mapped to memristor read voltages. After the completion of the VMM operation by the VMM engines 820, the output voltages must be inverse mapped to actual values. For input vector x and output vector V, the inverse mapping operation is accomplished as:

$$O = \frac{(V - b * \text{sum}(x))}{a}$$

The mapping and inverse mapping block 832 may perform mapping and inverse mapping procedures described above as part of the VMM signal processing chain.

Memory Management

Figure 10:
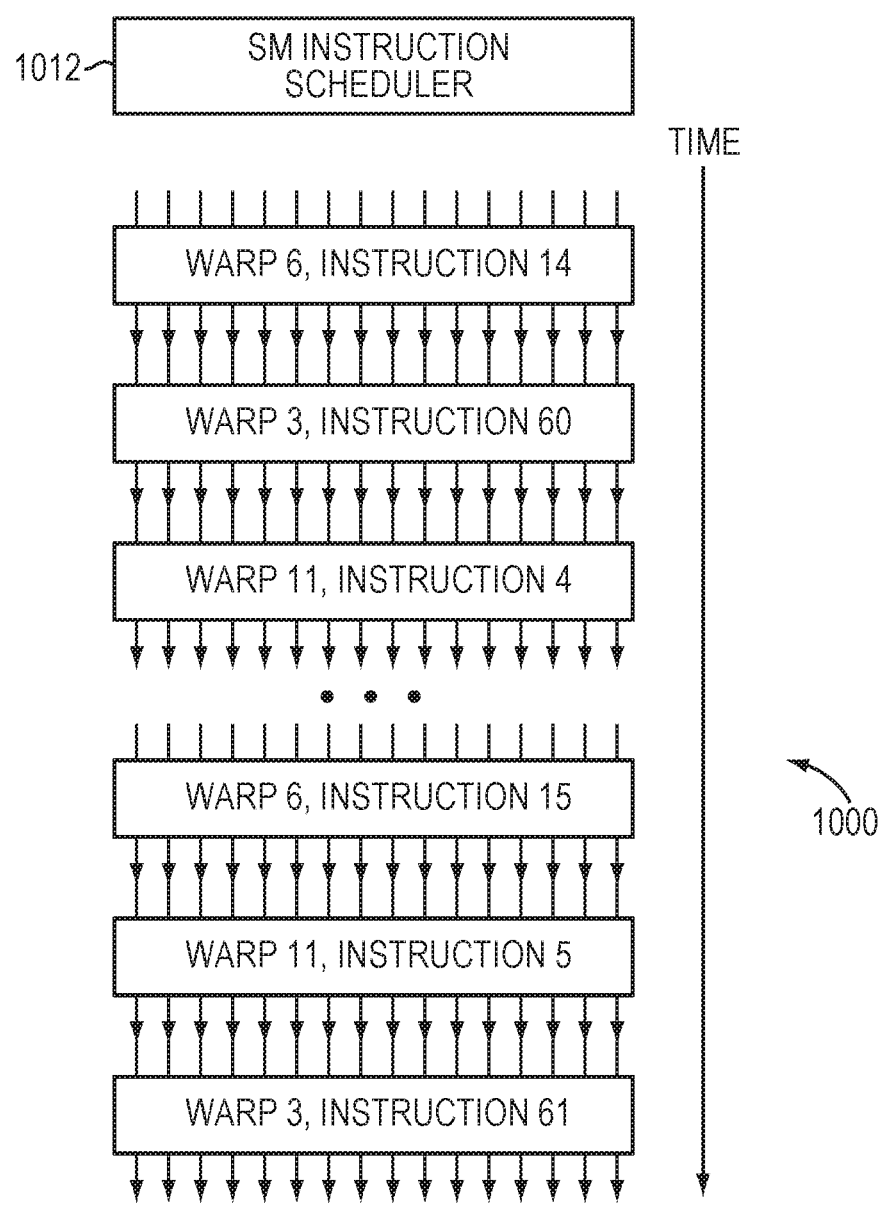
FIG. 10 is a flow diagram illustrating a threading process in one embodiment.

The system 800 may implement a number of solutions to manage the memory 806, thereby ensuring sufficient memory bandwidth to complete the VMM operations. Solutions that may be implemented by the system include the following:

Integral Threading: FIG. 10 is a flow diagram illustrating a threading process 1000 comparable to those implemented in a graphics processing unit (GPU). As shown, a streaming multiprocessor (SP) instruction scheduler 1012 groups thread blocks into "warps," with individual instructions scheduled for execution on a streaming multiprocessor.

Referring again to FIG. 9, the system 800 may provide "integral threading" by enabling concurrent processing on a per-crossbar row/column basis. Each row of a matrix can be assigned to a set of crossbar rows/columns in floating point engines by the analog co-processor, similar to the way each core in a CPU assigns a separate thread to each row. For example, a subset of the instructions 970 (I14, I60, I4) can each be assigned to a respective row of the VMM engine 822a, while another subset of instructions (I15, I61, I5) can each be assigned to a respective row of the VMM engine 822b, as shown in FIG. 9. The matrix row can be operated on in parallel by all the crossbars in an engine 822a-b, similar to the way each streaming multiprocessor in a GPU uses one unit of SIMD (Single Instruction Multiple Data) execution to work on each row. Programs can be executed on the crossbar arrays of the VMM engines 820 such that VMM computation executes concurrently within a crossbar array without explicit use of threads by using purely instruction level parallelism. This solution simplifies thread management and streamlines VMM processing relative to that performed in these digital systems. A Multi Thread (MT) Issue unit may be unneeded, and the instruction and data cache may reside on the host processor 990, with a high rate interconnect between the host processor 922 and the system 800. Thus, the system 800 may execute the instructions 970 in parallel, through physical computation, by applying vector inputs to memristor crossbar array rows within the VMM engines 820 after setting corresponding memristor crossbar array columns to desired multiplicative weight values. Each group of instructions may be bundled into a very long instruction word (VLIW) instruction for more efficient processing.

Figure 11:
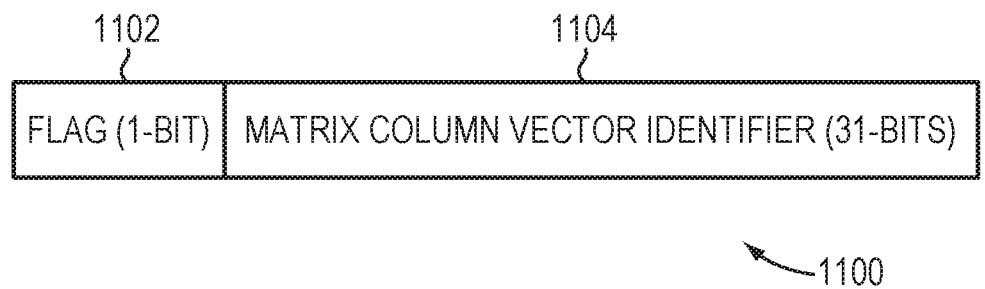
FIG. 11 is a block diagram of a data representation associated with a matrix column vector in one embodiment.

Data representation to facilitate VMM updates: FIG. 11 illustrates a data structure 1100 that may be implemented by the system 800 to represent data. The system 800 accelerates VMM operations, and high data throughput may be required to maximize use of the crossbar cores of the VMM engines 820. The data structure 1100 can facilitate updates to keep throughput high, while minimizing expensive write operations to crossbar cores. To accomplish this objective, column vectors can be encoded and stored in the memory 806 in a format that includes a flag bit 1102 and unique identifier 1104. In this data structure 1100, the data representation could encode a value corresponding to, for example, "No update, Column 1-Cell 1-Core 1-Floating Point Engine 1." If the column vector has changed and needs to be updated, its flag bit 1102 can be set, and an interrupt will be triggered to the host processor 990 to write the new value into the crossbar cores of the corresponding floating point engine 822a.

Scatter/Gather Vector Support: A host processor 990 can be used as a companion to the system 800 in a heterogeneous computing environment, featuring scatter/gather transaction support to improve throughput. Scatter/gather vector transactions may be used for I/O to crossbar arrays within the VMM engines 820, with values sent to crossbar array DACs. The scatter/gather vector transactions can improve throughput by accessing non-contiguous locations of the memory 806 more efficiently than conventional memory access methods. In a Gather operation, matrix column vectors are stored across a collection of sub-banks of SRAM memory, potentially through DMA access from DRAM. Matrix column vectors are read from SRAM memory into a request queue, then routed to designated Gather registers through a sub-bank address/data crossbar, and finally accessed by a VMM core from associated Gather registers. In a Scatter operation, a VMM core writes the values into an associated Scatter register, then routes these values through a sub-bank address/data crossbar to a designated request queue, and finally writes data into the intended sub-bank of SRAM memory. Outputs may be written to DRAM memory, potentially through DMA access.

The table below summarizes example write and read procedures for both the crossbar column vectors (memristor multiplication weights for VMM) and vector input data.

| Write and read crossbar voltage values to/from crossbar arrays | |
|---|---|
| Write | 1) Perform a Gather operation on selected matrix column vectors from host memory and map to conductance values on assigned crossbars. <br> 2) Write corresponding voltage values to co-processor DACs to program memristor weights for VMM. |
| Read | 1) Read voltages from crossbar array cells and inverse map from assigned crossbars. <br> 2) If memristor weight values need to be re-written, such as due to a calibration or compensation adjustment, Scatter data to memory if required. |
| Write and read vector input data values to/from crossbar arrays | |
| Write | 1) Gather vector input data from host memory. <br> 2) Map to assigned crossbars and send corresponding voltages to co-processor DACs. |
| Read | 1) Read voltages from crossbar array cells and inverse map from assigned crossbars. <br> 2) Return data values to host processor through interconnect, such as to complete VMM instruction that had been issued to the co-processor, and Scatter data to memory if required. |

Instruction Set Architecture and Integration

Custom instructions for VMM: Along with fabrication of digital blocks, the data formatting process can be extended with the creation of user defined instructions originating from a host device's CPU and running on the analog co-processor. Each major class of matrix operation can have a custom user instruction, which will be targeted to the analog co-processor. Custom instructions may be issued as extensions to an existing instruction set, with the ability to run on host devices. This allows for custom configuration of internal functional IP blocks.

A representative set of custom instructions to perform VMM in the analog co-processor include:

(a) Load/Store Custom: Custom Load instructions are used to program input values into memristor crossbar array rows and to program multiplicative weight values into memristor crossbar array columns within the analog co-processor's cells. Custom Store instructions are used to store VMM output values from memristor crossbar array columns within the analog co-processor's cells in memory. Custom Load and store instructions operate between a set of special-purpose registers devoted to VMM and memory (the VMM instruction and data cache and shared memory space).

(b) Vector matrix multiplication: Independent instructions for integer and floating point precision are defined, at varying levels of precision (ex. 32, 64, and 128 bit integer multiplication and 16, 32, 64, and 128 bit floating point computation). The analog co-processor architecture emphasizes floating point computation, and the specific configuration of cores and cells within floating point engines define that engine's computational precision, as previously described in the background section. Instructions of a particular multiplication type and precision must therefore be targeted only to a floating point engine that supports that computation. The vector matrix multiplication (as opposed to traditional multiplication) instruction facilitates greater I/O bandwidth into the memristor crossbar arrays within cells of the analog co-processor by amortizing per-operation control overhead.

(c) Bit manipulation instructions: The analog co-processor performs VMM by multiplying floating point mantissas within the memristor crossbar arrays of its cells, while normalizing floating point exponents and adjusting for floating point sign bits. This requires instructions that enable the extraction, insertion, shifting, rotating, and testing of individual bits within the analog co-processor's floating point registers. Instructions to manipulate mantissas, exponents, and sign bits are carried out within the larger process of the VMM signal processing chain.

(d) Transactional memory: Transactional memory instructions allow load and store instructions to operate in an atomic manner. The analog co-processor often performs concurrent reads and writes of shared data between many cells operating in parallel as it loads and stores values for VMM processing. This requires extensive coordination between crossbar array cells, which is facilitated by atomic load and store.

As an illustrative example, the following pseudocode defines a sequence of instruction processing in the VMM signal processing chain, with instructions translated from pseudocode y=Ax:

a) Data_Format (R0): Custom instruction to identify the type of operation as matrix multiplication versus a 2D convolution/correlation operation. Updates register R0 with a corresponding flag (ex. 1 to indicate matrix multiplication).

b) Load (R1, A): Loads contents of matrix A into register R1. This may be performed as a sequence of loads, depending on the maximum register size.

c) Load (R2, x): Loads contents of vector x into register R2. Again, this may be performed as a sequence of loads, depending on the maximum register size.

d) Normalize (R3, R4, R1, R2): Custom instruction to normalize the contents of registers R1 and R2 and return the values back to registers R3 and R4 respectively. This high level instruction is made up of a subset of lower level instructions such as compare and bit shift operations.

e) MapMatrix (R5, R3): Custom instruction to map the contents of register R3 to conductance values and store them in register R5. This high level instruction is made up of a subset of lower level instructions such as multiply and divide.

f) MapVector (R6, R4): Custom instruction to map the contents of register R4 to input voltage values and store them in register R6. This high level instruction is made up of a subset of lower level instructions such as multiply and divide.

g) LoadCustom ({Engine1-Core1-Cell1}, R5): Custom instruction to write conductance values of R5 to a particular floating point engine cell, Engine1-Core1-Cell1. This may be performed as a sequence of Load-Customs, depending on the maximum register size.

h) VMM ({Engine1-Core1-Cell1}, R5): Custom instruction to perform multiplication of voltage values of R6 with conductance values of Engine 1-Core 1-Cell 1.

i) StoreCustom (R7, {Engine1-Core1-Cell1}): Custom instruction to store the outputs of VMM operation. The outputs are ultimately returned to the calling program, after corresponding instructions to inverse map and de-normalize.

Figure 12:
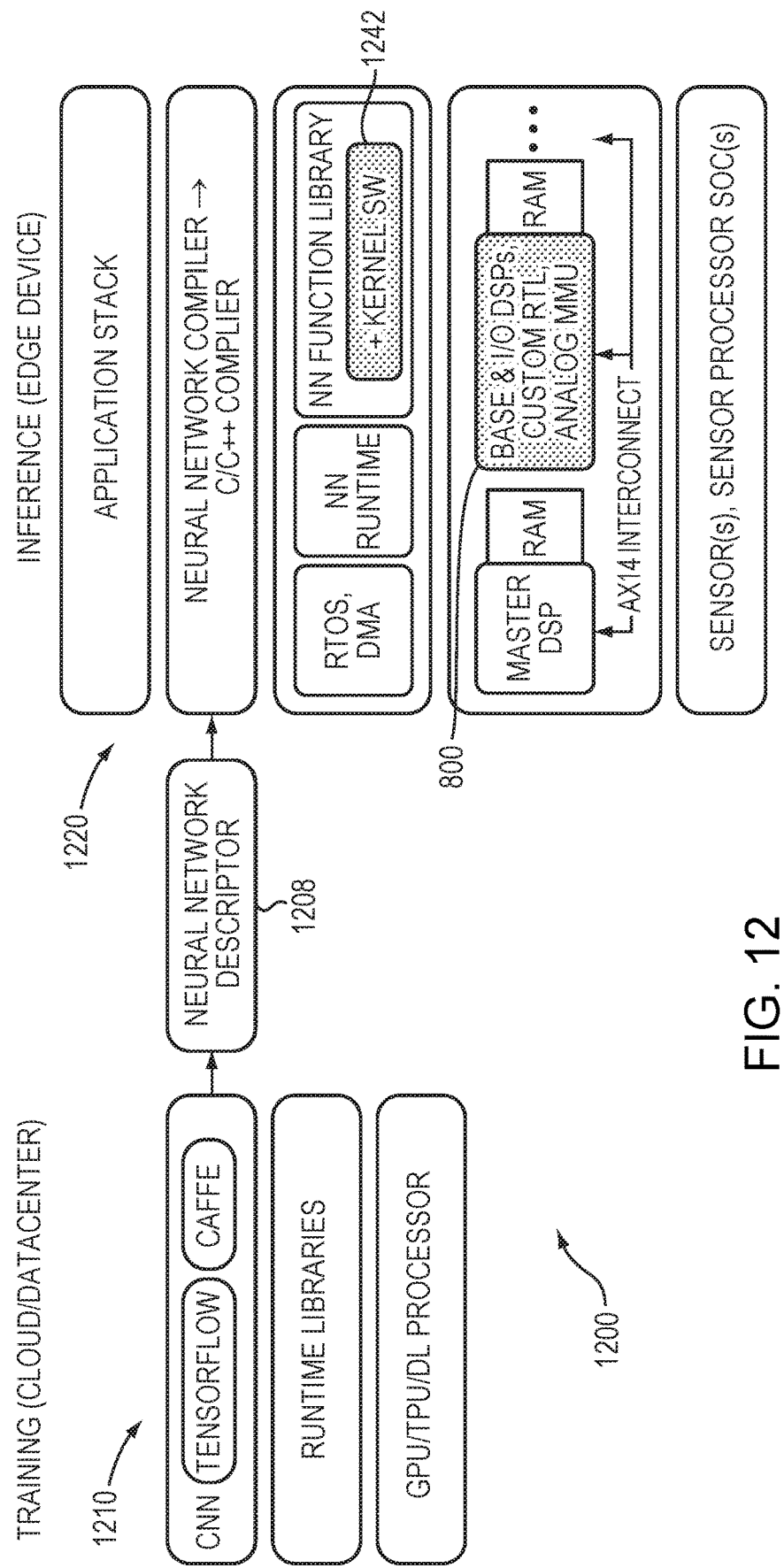
FIG. 12 is a block diagram of a computational system interfacing with a networked device in one embodiment.
Figures 13A, 13B:
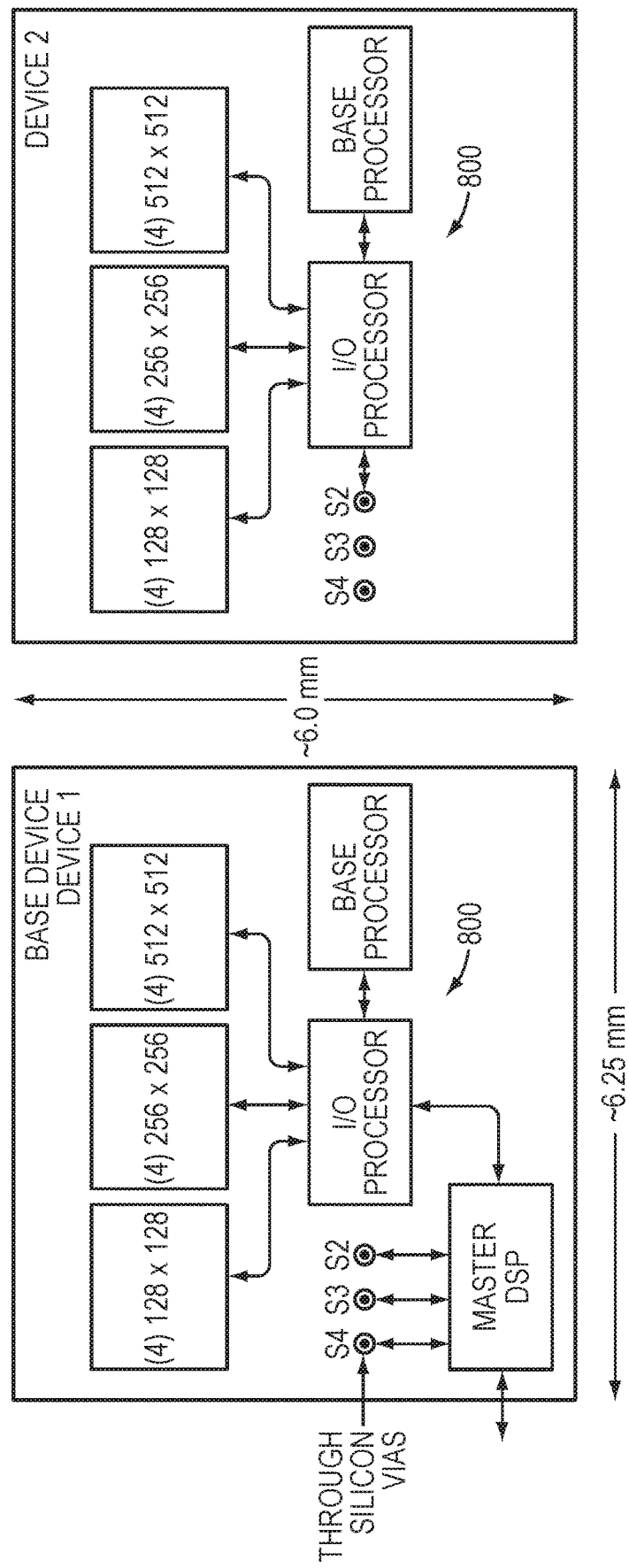
FIGS. 13A-D are block diagrams illustrating systems configured in a stacked configuration in example embodiments.
Figure 13D:
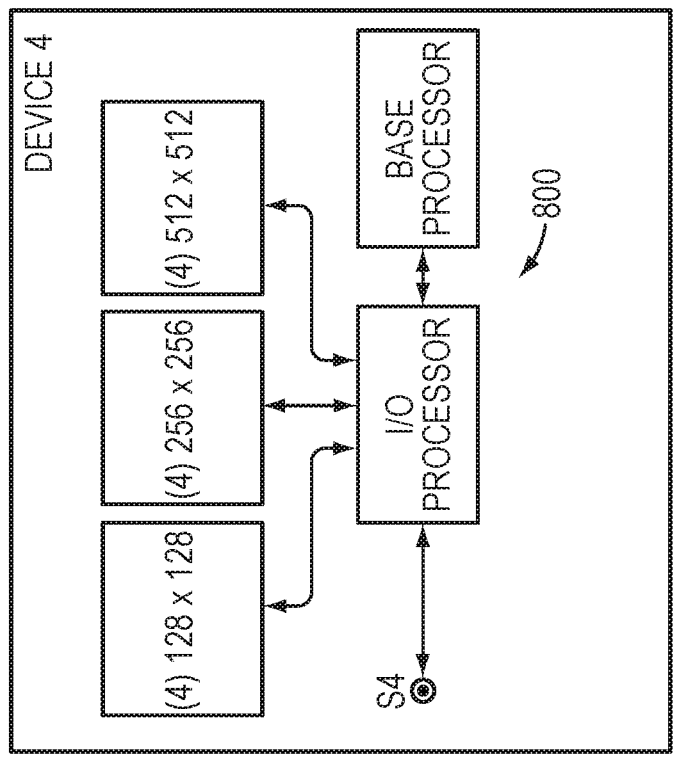
Figure 13C:
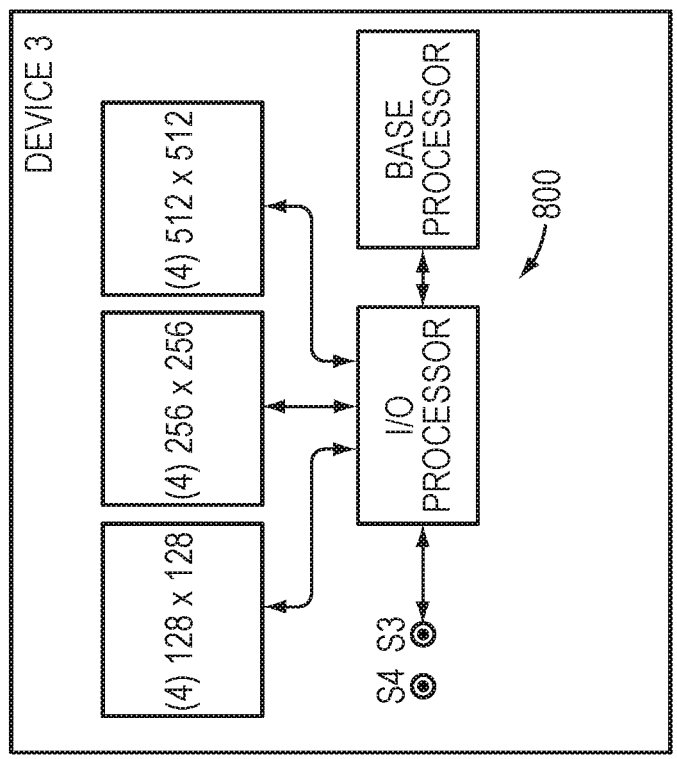

Host Device Integration: FIG. 12 is a block diagram of a system 1200 in which the computational system 800 may be integrated with host device 1220. The system 800 can be integrated within a host device 1220 (e.g., integrated into a common system-on-chip (SoC)) to form an end-to-end solution, with VMM-accelerated functions defined in software kernels 1242 and ultimately run on the computational system 800. In this example, the networked system 1200 is configured as a neural network application.

The host (edge) device 1220 may contain an application stack tasked with performing neural network inference, receiving a neural network model descriptor 1208 that has been trained in a cloud/data center 1210. This neural network descriptor 1208 can be compiled into a standard language such as C/C++ using a customized neural network compiler, and then further compiled into instructions to be run on a Master digital signal processor (DSP) running a real time operating system (RTOS) and a neural network runtime environment. Software kernels 1242 tied to a neural network function library may define a set of VMM functions to be accelerated on the edge device containing DSPs. The VMM data associated with these accelerated functions can be accessed directly from an integrated DMA. Custom instructions from the Master DSP can be passed to the system's 800 floating point engines, collectively termed the Analog Matrix Multiplication Unit (MMU), to execute vector-matrix multiplication. These instructions can be passed across a system bus from the Master DSP through a dedicated interconnect to a DSP co-located with the Analog MMU that is tasked purely with I/O into and out of the Analog MMUs crossbar arrays (the I/O DSP). Memristor write updates and memory management tasks, as previously described, may be initiated by a separate Base DSP. This Base DSP may implement the VMM signal processing chain logic blocks through custom RTL, as well as calibration and compensation algorithms and non-linear operations in support of neural network inference.

Because the system 800 acts as a processing-in-memory device, storing multiplicative weights directly in memristor devices, data movement between memory and the crossbar arrays where VMM takes place is minimized. One goal is to get input data for the MAC operations comprising the VMM into and out of the crossbar arrays of the system 800, and this task is managed by the dedicated I/O processor, which may be a configurable DSP. The I/O processor may support the custom instruction set previously defined, including custom load and store instructions, to move data into and out of the analog matrix multiplication unit. It may also have high throughput interfaces, such as high-speed queues, to provide the analog matrix multiplication unit with sufficient I/O bandwidth to make use of its computing capacity.

3D Die Stacking with I/O and Base Processors: FIGS. 13A-D are block diagrams illustrating systems configured in a stacked configuration in example embodiments. A key consideration within edge computing devices is spatial efficiency, as integrated circuit (IC) footprints should be kept as small as possible. 3D System on Chips (SoCs) provide a means of reducing IC footprint and maximizing throughput between computing and memory units on the SoC.

The system 800 may be implemented in a 3D SoC in a number of different configurations. As shown in each of the example configurations in FIGS. 13A-D, a 3D stack of individual 2D IC layers, each layer containing I/O and base processors and a number of analog engines (e.g., 4) which contain memristor crossbar arrays of a given size (e.g., 128×128, 256×256, 512×512), can be formed and connected using through silicon vias. These vias serve to connect the various layers with each other, as well as to the Master DSP. A representative size for each 2D layer in the stack may be 6 mm×6.25 mm, and a 3D stack of these layers may be formed from a number of 2D layers (ex. 4).

While example embodiments have been particularly shown and described, it will be understood by those skilled in the art that various changes in form and details may be made therein without departing from the scope of the embodiments encompassed by the appended claims.

What is claimed is:

1. A circuit comprising:
a vector matrix multiplication (VMM) processor configured to perform a floating point VMM operation, each floating point VMM processor comprising at least one memristor network having an array of analog memristor devices arranged in a crossbar configuration; and
a controller configured to provide input matrix data to the VMM processor, the controller being configured to:
a) retrieve read data from a memory, the read data specifying a computation to be processed by the VMM processor;
b) determine, based on the read data, a type of matrix multiplication to be performed from a plurality of types of matrix multiplication;
c) generate, from the read data, input matrices having a format specific to the type of matrix multiplication to be performed;
d) determine, from the read data, a computational precision of the floating point VMM operation from a plurality of computational precisions and parse the sign, exponent, and mantissa data fields from floating point elements of input matrices,
e) normalize the exponent data fields for at least one column of the at least one memristor network by aligning mantissas such that all floating point values stored in the column use the same exponent, and
f) send the input matrix data to the VMM processor.

2. The circuit of claim 1, wherein, in response to the type being a general matrix-matrix (GEMM) multiplication, the controller is further configured to 1) generate the input matrices according to a row-by-row sequence of the read data, and 2) apply the input matrices to an input of the VMM processor, wherein the VMM processor is further configured to apply the input matrices to the at least one memristor network.

3. The circuit of claim 1, wherein the VMM processor and controller are configured in a system-on-chip having a multi-layer stack of plural 2D integrated circuit (IC) layers, each of the plural layers including a subset of the at least one memristor network, each of the plural layers being linked by through silicon vias (TSVs).

4. A circuit comprising:
a vector matrix multiplication (VMM) processor configured to perform a floating point VMM operation, each floating point VMM processor comprising at least one memristor network having an array of analog memristor devices arranged in a crossbar configuration; and
a controller configured to interface with the VMM processor, the controller being configured to:
a) retrieve read data from a memory;
b) determine, based on the read data, a type of matrix multiplication to be performed;
c) generate input matrices having a format specific to the type of matrix multiplication to be performed;
d) determine a computational precision of the floating point VMM operation and parse the sign, exponent, and mantissa data fields from floating point elements of input matrices,
e) normalize the exponent data fields for at least one column of the at least one memristor network by aligning mantissas such that all floating point values stored in the column use the same exponent, and
f) send the input matrix data to the VMM processor;
wherein, in response to the type being a general matrix-matrix (GEMM) multiplication, the controller is further configured to 1) generate the input matrices according to a row-by-row sequence of the read data, and 2) apply the input matrices to an input of the VMM processor, wherein the VMM processor is further configured to apply the input matrices to the at least one memristor network;
wherein the input to the VMM processor includes a VMM signal-processing chain, the chain comprising digital logic blocks that perform a set of sequential functions to prepare floating point data for VMM, the functions including at least one of exponent normalization/de-normalization and memristor network mapping/inverse mapping.

5. The circuit of claim 1, wherein, in response to the type being a two-dimensional (2D) convolution and correlation, the controller is further configured to 1) generate the input matrices as an overlapping sequence of the read data, the overlapping sequence representing a shift of a convolution operation, and 2) apply the input matrices to an input of the VMM processor, wherein the VMM processor is further configured to apply the input matrices to the at least one memristor network.

6. The circuit of claim 1, wherein the controller is further configured to:
a) identify an exponent of a maximum value of a floating point number retrieved from the read data;
b) determine normalized exponents for other values of the floating point number as a function of the exponent, the other values being values other than the maximum value;
c) modify the other values by replacing a respective exponent with a respective normalized exponent; and
d) convert result data from the at least one memristor network to a floating point value based on the normalized exponents through a de-normalization process.

7. The circuit of claim 1, wherein the controller is further configured to:

a) identify a matrix to be stored into at least one memristor network;
b) define mapping coefficients for the matrix based on 1) a highest conductance value and a lowest conductance value of the operating range of the analog memristor devices of the at least one memristor network and 2) a highest value and a lowest value of the matrix;
c) defining a map relating elements of the matrix to conductance values of the at least one memristor network based on the mapping coefficients;
d) cause the VMM processor to store the matrix to the at least one memristor network as a function of the map; and
e) convert result data from the at least one memristor network to numeric matrix values based on the map through an inverse mapping process.

8. The circuit of claim 1, wherein the controller is further configured to:
a) receive a plurality of instructions from a host processor's instruction cache based on the VMM operation to be performed, each of the plurality of instructions specifying configuration of an individual row of the at least one memristor network; and
b) cause the VMM processor to execute the plurality of instructions in parallel via the at least one memristor network.

9. The circuit of claim 8, wherein the controller is further configured to forward the plurality of instructions to the VMM processor as a very long instruction word (VLIW) instruction.

10. The circuit of claim 1, wherein the controller is further configured to:
a) identify, from the read data, column vectors to be written to the at least one memristor network;
b) generate, for each of the column vectors, 1) an identifier representing a tier of a hierarchy of the at least one memristor network, and 2) a flag bit indicating whether to update a value corresponding to the column vector; and
c) store the column vectors and respective identifiers and flag bits to the memory.

11. The circuit of claim 1, wherein the controller is further configured to:
a) identify, from the read data, matrix column vectors to be written to the at least one memristor network;
b) perform a Gather operation on the matrix column vectors; such that
i. matrix column vectors are stored across a collection of sub-banks of SRAM memory, and
ii. matrix column vectors are read from SRAM memory into a request queue, routed to designated Gather registers through a sub-bank address/data crossbar, and accessed by a VMM processor from associated Gather registers;
c) map the matrix column vectors contained in Gather registers to conductance values of crossbars of the at least one memristor network of the VMM processor; and
d) determine memristor weight values to program the at least one memristor network of the VMM processor based on the map.

12. The circuit of claim 1, wherein the controller is further configured to:
a) read voltage outputs from the crossbars;
b) map the voltage outputs to numeric matrix values; and
c) store the numeric matrix values to memory through a Scatter operation;

such that
   i. the VMM processor writes the values into an associated Scatter register, then routes these values through a sub-bank address/data crossbar to a designated request queue, and writes data into the intended sub-bank of SRAM memory
   ii. outputs are available be written to DRAM memory through DMA access.

13. The circuit of claim 1, wherein the controller is further configured to:
   a) retrieve, from the read data, vector input data values be written to the at least one memristor network;
   b) perform a Gather operation on the vector input data; such that
      i. vector input data is stored across a collection of sub-banks of SRAM memory, and
      ii. vector input data is read from SRAM memory into a request queue, and then routed to designated Gather registers through a sub-bank address/data crossbar, and finally accessed by a VMM processor from associated Gather registers
   c) map the vector input data values to crossbars of the at least one memristor network in the VMM processor; and
   d) determine memristor voltages to program the at least one memristor network of the VMM processor based on the map.

14. The circuit of claim 1, wherein the controller is further configured to:
   a) identify a custom instruction from the read data, the custom instruction being a user-defined instruction originating from a host processor and defining an operation associated with VMM; and
   b) cause the VMM processor to configure the at least one memristor network in accordance with the custom instruction.

15. The circuit of claim 14, wherein the custom instruction includes a load/store instruction to 1) program input values into memristor crossbar array rows and to program multiplicative weight values into the at least one memristor network within the VMM processor, and 2) store VMM output values from the at least one memristor network within the VMM processor into memory.

16. The circuit of claim 14, wherein the custom instruction includes a VMM instruction to 1) define parameters including VMM floating point precision, 2) format and map VMM data into the at least one memristor network within the VMM processor, and 3) facilitate greater input/output (I/O) bandwidth by amortizing per-operation control overhead through VLIW processing.

17. The circuit of claim 14, wherein the custom instruction includes a bit manipulation instruction defining at least one of extraction, insertion, shifting, rotating, and testing of individual bits within the VMM processor's floating point registers, wherein instructions to manipulate mantissas, exponents, and sign bits are carried out within a larger process of a VMM signal processing chain.

18. The circuit of claim 14, wherein the custom instruction includes a transactional memory instruction defining input/output (I/O) efficiency and Scatter/Gather instructions, and further defining atomic operation of the custom instruction to facilitate coordination in reading/writing values into the at least one memristor network of the VMM processor.

19. The circuit of claim 1, wherein the controller is further configured to interface with a neural network system-on-chip (SoC), the controller being configured to:
   a) comprise a pair of digital signal processors, such that
      i. one digital signal processor is devoted solely to input/output (I/O) into and out of the at least one memristor network of the VMM processor
      ii. a second digital signal processor is devoted to digital architecture functions such as the VMM signal processing chain, memory management, non-linear operations, custom instruction processing, and calibration/compensation algorithms
   b) interface to the neural network system-on-chip, such that
      i. the SoC is tasked with a neural network inference workload defined by a neural network model descriptor, and contains a set of kernel functions to be run on VMM processors
      ii. the model descriptor's kernel functions are compiled into custom instructions to be passed by the neural network system-on-chip through a high speed interconnect to the set of digital signal processors
   c) receive and process instructions through the set of digital signal processors to cause the VMM processor to execute the VMM functions.

* * * * *